US012029133B2

(12) United States Patent
Lill et al.

(10) Patent No.: US 12,029,133 B2
(45) Date of Patent: Jul. 2, 2024

(54) ION BEAM ETCHING WITH SIDEWALL CLEANING

(71) Applicant: Lam Research Corporation, Fremont, CA (US)

(72) Inventors: Thorsten Lill, Santa Clara, CA (US); Ivan L. Berry, III, Green Valley, AZ (US)

(73) Assignee: Lam Research Corporation, Fremont, CA (US)

( * ) Notice: Subject to any disclaimer, the term of this patent is extended or adjusted under 35 U.S.C. 154(b) by 193 days.

(21) Appl. No.: 17/432,059

(22) PCT Filed: Feb. 26, 2020

(86) PCT No.: PCT/US2020/019927
§ 371 (c)(1),
(2) Date: Aug. 18, 2021

(87) PCT Pub. No.: WO2020/176640
PCT Pub. Date: Sep. 3, 2020

(65) Prior Publication Data
US 2022/0131071 A1    Apr. 28, 2022

Related U.S. Application Data

(60) Provisional application No. 62/812,052, filed on Feb. 28, 2019.

(51) Int. Cl.
*H10N 50/01* (2023.01)
*G11C 11/16* (2006.01)
(Continued)

(52) U.S. Cl.
CPC .......... *H10N 50/01* (2023.02); *G11C 11/161* (2013.01); *H10B 61/00* (2023.02); *H10N 50/10* (2023.02); *H10N 50/80* (2023.02); *H10N 50/85* (2023.02)

(58) Field of Classification Search
None
See application file for complete search history.

(56) References Cited

U.S. PATENT DOCUMENTS

| 3,704,511 A | 12/1972 | Hooker |
| 3,899,711 A | 8/1975 | Lemmond |

(Continued)

FOREIGN PATENT DOCUMENTS

| CA | 1157511 | 11/1983 |
| CA | 1184239 | 3/1985 |

(Continued)

OTHER PUBLICATIONS

CN Office Action dated Jul. 20, 2021, in application No. CN201910836307.8.

(Continued)

*Primary Examiner* — Roberts P Culbert
(74) *Attorney, Agent, or Firm* — Weaver Austin Villeneuve & Sampson LLP

(57) ABSTRACT

Patterned magnetoresistive random access memory (MRAM) stacks are formed by performing a main etch through a plurality of MRAM layers disposed on a substrate, where the main etch includes using ion beam etching (IBE). After the main etch, gapfill dielectric material is deposited in spaces between the patterned MRAM stacks, and the gapfill dielectric material is selectively etched or otherwise formed to an etch depth that is above a depth of an underlayer. After the gapfill dielectric material is formed, at least some of the gapfill dielectric material and any electrically conductive materials deposited on sidewalls of the patterned MRAM stacks are removed by performing an IBE trim etch.

17 Claims, 10 Drawing Sheets

(51) Int. Cl.
  *H10B 61/00* (2023.01)
  *H10N 50/10* (2023.01)
  *H10N 50/80* (2023.01)
  *H10N 50/85* (2023.01)

(56) References Cited

U.S. PATENT DOCUMENTS

| | | | |
|---|---|---|---|
| 3,969,646 | A | 7/1976 | Reader et al. |
| 4,200,794 | A | 4/1980 | Newberry et al. |
| 4,419,580 | A | 12/1983 | Walker et al. |
| 4,873,445 | A | 10/1989 | Le Jeune |
| 5,010,842 | A | 4/1991 | Oda et al. |
| 5,248,371 | A | 9/1993 | Maher et al. |
| 5,284,544 | A | 2/1994 | Mizutani et al. |
| 5,350,499 | A | 9/1994 | Shibaike et al. |
| 5,472,565 | A | 12/1995 | Mundt et al. |
| 5,675,606 | A | 10/1997 | Brainard et al. |
| 5,811,022 | A | 9/1998 | Savas et al. |
| 5,958,134 | A | 9/1999 | Yasar et al. |
| 6,063,710 | A | 5/2000 | Kadomura et al. |
| 6,110,287 | A | 8/2000 | Arai et al. |
| 6,153,474 | A | 11/2000 | Ho et al. |
| 6,235,643 | B1 | 5/2001 | Mui et al. |
| 6,515,426 | B1 | 2/2003 | Tanaka et al. |
| 6,547,977 | B1 | 4/2003 | Yan et al. |
| 6,579,372 | B2 | 6/2003 | Park |
| 6,617,595 | B1 | 9/2003 | Okunuki |
| 6,821,910 | B2 | 11/2004 | Adomaitis et al. |
| 6,965,138 | B2 | 11/2005 | Nakajima et al. |
| 7,037,846 | B2 | 5/2006 | Srivastava et al. |
| 7,320,167 | B2 | 1/2008 | Takano |
| 7,416,989 | B1 | 8/2008 | Liu et al. |
| 7,767,561 | B2 | 8/2010 | Hanawa et al. |
| 7,935,942 | B2 | 5/2011 | England et al. |
| 7,977,249 | B1 | 7/2011 | Liu et al. |
| 7,981,763 | B1 | 7/2011 | van Schravendijk et al. |
| 8,058,179 | B1 | 11/2011 | Draeger et al. |
| 8,187,486 | B1 | 5/2012 | Liu et al. |
| 8,608,973 | B1 | 12/2013 | Guha |
| 8,617,411 | B2 | 12/2013 | Singh |
| 9,166,154 | B2 | 10/2015 | Satoh et al. |
| 9,406,535 | B2 | 8/2016 | Berry, III et al. |
| 9,536,748 | B2 | 1/2017 | Berry, III et al. |
| 9,564,297 | B2 | 2/2017 | Wu et al. |
| 9,779,955 | B2 | 10/2017 | Lill et al. |
| 9,837,254 | B2 | 12/2017 | Berry, III et al. |
| 9,916,993 | B2 | 3/2018 | Berry, III et al. |
| 10,483,085 | B2 | 11/2019 | Berry, III et al. |
| 10,580,628 | B2 | 3/2020 | Berry, III et al. |
| 10,825,652 | B2 | 11/2020 | Berry, III et al. |
| 10,847,374 | B2 | 11/2020 | Belau et al. |
| 10,998,167 | B2 | 5/2021 | Berry, III et al. |
| 11,062,920 | B2 | 7/2021 | Berry, III et al. |
| 11,289,306 | B2 | 3/2022 | Lill et al. |
| 2001/0006093 | A1 | 7/2001 | Tabuchi et al. |
| 2002/0025681 | A1 | 2/2002 | Chi et al. |
| 2003/0003755 | A1 | 1/2003 | Donohoe |
| 2003/0098126 | A1 | 5/2003 | Yeom et al. |
| 2003/0168588 | A1 | 9/2003 | Brailove et al. |
| 2004/0065849 | A1 | 4/2004 | Larson |
| 2004/0084410 | A1 | 5/2004 | Lenz |
| 2004/0090607 | A1 | 5/2004 | Yoshida |
| 2004/0161943 | A1 | 8/2004 | Ren et al. |
| 2004/0264044 | A1 | 12/2004 | Konishi et al. |
| 2005/0001527 | A1 | 1/2005 | Sugiyama |
| 2005/0003672 | A1 | 1/2005 | Kools et al. |
| 2005/0032388 | A1 | 2/2005 | Donohoe |
| 2005/0199822 | A1 | 9/2005 | Saini et al. |
| 2005/0211926 | A1 | 9/2005 | Ito et al. |
| 2005/0214478 | A1 | 9/2005 | Hanawa et al. |
| 2005/0218114 | A1 | 10/2005 | Yue et al. |
| 2006/0019477 | A1 | 1/2006 | Hanawa et al. |
| 2006/0192104 | A1 | 8/2006 | Schultz et al. |
| 2006/0226120 | A1 | 10/2006 | Rusu et al. |
| 2006/0243389 | A1 | 11/2006 | Hirayama et al. |
| 2007/0017636 | A1 | 1/2007 | Goto et al. |
| 2007/0049018 | A1 | 3/2007 | Sandhu et al. |
| 2007/0063337 | A1 | 3/2007 | Schubert et al. |
| 2007/0068624 | A1 | 3/2007 | Jeon et al. |
| 2007/0087574 | A1 | 4/2007 | Gupta et al. |
| 2007/0181820 | A1 | 8/2007 | Hwang et al. |
| 2008/0132046 | A1 | 6/2008 | Walther |
| 2008/0179186 | A1 | 7/2008 | Shimura et al. |
| 2008/0302303 | A1 | 12/2008 | Choi et al. |
| 2009/0053900 | A1 | 2/2009 | Nozawa et al. |
| 2009/0068849 | A1 | 3/2009 | Endo et al. |
| 2009/0203218 | A1 | 8/2009 | Matsuyama et al. |
| 2010/0178770 | A1 | 7/2010 | Zin |
| 2010/0264335 | A1 | 10/2010 | Hoyle et al. |
| 2011/0100954 | A1 | 5/2011 | Satake et al. |
| 2011/0132874 | A1 | 6/2011 | Gottscho et al. |
| 2011/0201208 | A1 | 8/2011 | Kawakami et al. |
| 2011/0212625 | A1 | 9/2011 | Toyoda et al. |
| 2011/0214814 | A1 | 9/2011 | Iizuka et al. |
| 2012/0126118 | A1 | 5/2012 | Suzuki et al. |
| 2012/0255678 | A1 | 10/2012 | Holland et al. |
| 2012/0288799 | A1 | 11/2012 | Takase et al. |
| 2013/0137275 | A1 | 5/2013 | Tong et al. |
| 2013/0154037 | A1 | 6/2013 | Guha |
| 2013/0216959 | A1 | 8/2013 | Tanaka et al. |
| 2014/0021343 | A1 | 1/2014 | Kirkpatrick et al. |
| 2014/0070342 | A1 | 3/2014 | Sandhu et al. |
| 2014/0076716 | A1 | 3/2014 | Gorokhovsky et al. |
| 2014/0083978 | A1 | 3/2014 | Mahadeswaraswamy et al. |
| 2014/0093745 | A1 | 4/2014 | Fan |
| 2014/0124363 | A1 | 5/2014 | Abarra et al. |
| 2014/0227866 | A1 | 8/2014 | Taylor |
| 2014/0238637 | A1 | 8/2014 | Tanaka |
| 2014/0287591 | A1 | 9/2014 | Nishimura et al. |
| 2014/0356985 | A1 | 12/2014 | Ricci et al. |
| 2015/0123006 | A1 | 5/2015 | Sinclair et al. |
| 2015/0179393 | A1 | 6/2015 | Colvin et al. |
| 2015/0287911 | A1 | 10/2015 | Kim et al. |
| 2015/0311292 | A1 | 10/2015 | Srinivasan et al. |
| 2015/0364349 | A1 | 12/2015 | Guha |
| 2016/0035972 | A1 | 2/2016 | Lee et al. |
| 2016/0049281 | A1 | 2/2016 | Berry, III et al. |
| 2016/0064232 | A1 | 3/2016 | Berry, III et al. |
| 2016/0064260 | A1 | 3/2016 | Berry, III et al. |
| 2016/0111294 | A1 | 4/2016 | Berry, III et al. |
| 2016/0181117 | A1 | 6/2016 | Arghavani et al. |
| 2016/0204342 | A1 | 7/2016 | Hayashi et al. |
| 2016/0218015 | A1 | 7/2016 | Oomori et al. |
| 2016/0307781 | A1 | 10/2016 | Berry, III et al. |
| 2016/0308112 | A1 | 10/2016 | Tan et al. |
| 2016/0336509 | A1 | 11/2016 | Jeong et al. |
| 2016/0351407 | A1 | 12/2016 | Sawataishi et al. |
| 2016/0351798 | A1 | 12/2016 | Shen et al. |
| 2016/0379856 | A1 | 12/2016 | Tomura et al. |
| 2016/0380028 | A1 | 12/2016 | Sonoda et al. |
| 2017/0047510 | A1 | 2/2017 | Chen et al. |
| 2017/0062181 | A1 | 3/2017 | Berry, III et al. |
| 2017/0069834 | A1 | 3/2017 | Annapragada et al. |
| 2017/0148976 | A1 | 5/2017 | Annunziata et al. |
| 2017/0229316 | A1 | 8/2017 | Sula et al. |
| 2017/0250087 | A1 | 8/2017 | Lill et al. |
| 2017/0372911 | A1 | 12/2017 | Lill et al. |
| 2018/0019387 | A1 | 1/2018 | Tan et al. |
| 2018/0047548 | A1 | 2/2018 | Berry, III et al. |
| 2018/0166304 | A1 | 6/2018 | Berry, III et al. |
| 2018/0233662 | A1 | 8/2018 | Berry, III et al. |
| 2018/0286707 | A1 | 10/2018 | Hudson et al. |
| 2019/0131135 | A1 | 5/2019 | Belau et al. |
| 2019/0237298 | A1 | 8/2019 | Berry, III et al. |
| 2020/0144493 | A1* | 5/2020 | Shen ............... H01F 10/3254 |
| 2022/0102624 | A1 | 3/2022 | Yun et al. |

FOREIGN PATENT DOCUMENTS

| | | |
|---|---|---|
| CN | 2501657 Y | 7/2002 |
| CN | 1538539 A | 10/2004 |
| CN | 1577845 A | 2/2005 |
| CN | 1661762 A | 8/2005 |
| CN | 201544052 U | 8/2010 |

(56) References Cited

FOREIGN PATENT DOCUMENTS

| | | |
|---|---|---|
| CN | 102422389 A | 4/2012 |
| CN | 102576667 A | 7/2012 |
| CN | 202291523 U | 7/2012 |
| CN | 103154309 A | 6/2013 |
| CN | 103154310 A | 6/2013 |
| CN | 103620730 A | 3/2014 |
| CN | 104282521 A | 1/2015 |
| CN | 104718614 A | 6/2015 |
| JP | 06-208837 A | 7/1994 |
| JP | 2003035700 A | 2/2003 |
| JP | 2003-201957 A | 7/2003 |
| JP | 2004139681 A | 5/2004 |
| JP | 2005-004068 A | 1/2005 |
| JP | 2006310633 A | 11/2006 |
| JP | 2009507351 A | 2/2009 |
| JP | 2009-531535 A | 9/2009 |
| JP | 2011-222960 A | 11/2011 |
| JP | 2012-057251 A | 3/2012 |
| JP | 2013-514633 A | 4/2013 |
| JP | 5432396 | 3/2014 |
| JP | 2011-086966 | 8/2014 |
| JP | 2014183184 A | 9/2014 |
| JP | 2015192150 A | 11/2015 |
| JP | 6053819 B2 | 12/2016 |
| JP | 2016208031 A | 12/2016 |
| KR | 20080037704 A | 4/2008 |
| KR | 20080107968 A | 12/2008 |
| KR | 2009-0033579 A | 4/2009 |
| KR | 10-2011-0097193 A | 8/2011 |
| KR | 20110098680 A | 9/2011 |
| KR | 20120104222 A | 9/2012 |
| KR | 20140023350 A | 2/2014 |
| KR | 20150007993 A | 1/2015 |
| KR | 20150032811 A | 3/2015 |
| KR | 101529821 B1 | 6/2015 |
| KR | 10-2017-0027925 A | 3/2017 |
| KR | 20170100435 A | 9/2017 |
| KR | 101939481 B1 | 1/2019 |
| TW | 200706849 A | 2/2007 |
| TW | 200926326 A | 6/2009 |
| TW | 201009625 A | 3/2010 |
| TW | 201044921 A1 | 12/2010 |
| TW | 201535811 A | 9/2015 |
| TW | 201619433 A | 6/2016 |
| TW | 201841360 A | 11/2018 |
| TW | I671427 B | 9/2019 |
| WO | WO94/05035 A1 | 3/1994 |
| WO | WO-2007028595 A2 | 3/2007 |
| WO | WO2007/106076 A2 | 9/2007 |
| WO | WO2010/120805 A2 | 10/2010 |
| WO | WO2012/047882 A2 | 4/2012 |
| WO | WO2012/047882 A3 | 4/2012 |
| WO | WO-2012141863 A1 | 10/2012 |
| WO | WO2012/151108 A1 | 11/2012 |
| WO | WO2013/012620 A1 | 1/2013 |
| WO | WO-2015134137 A1 | 9/2015 |

OTHER PUBLICATIONS

International Preliminary Report on Patentability dated Aug. 12, 2021 issued in Application No. PCT/US2020/015587.
International Preliminary Report on Patentability dated Sep. 10, 2021 issued in Application No. PCT/US2020/019927.
International Search Report and Written Opinion dated May 20, 2020 issued in Application No. PCT/US2020/015587.
KR Office Action dated Jul. 14, 2022, in Application No. KR10-2015-0145426 With English translation.
KR Office Action dated Jun. 16, 2022 in Application No. KR10-2015-0121480 With English translation.
KR Office Action dated May 31, 2022, in Application No. KR10-2015-0113464 with English translation.
U.S. Notice of Allowance dated Nov. 24, 2021 issued in U.S. Appl. No. 15/682,369.
U.S. Office Action dated Aug. 2, 2021 issued in U.S. Appl. No. 15/682,369.
U.S. Notice of Allowance, dated Jun. 20, 2016, issued in U.S. Appl. No. 14/473,863.
U.S. Office Action, dated Jul. 27, 2017, issued in U.S. Appl. No. 15/191,176.
U.S. Notice of Allowance, dated Nov. 16, 2017, issued in U.S. Appl. No. 15/191,176.
U.S. Office Action, dated Nov. 29, 2019, issued in U.S. Appl. No. 15/880,266.
U.S. Final Office Action, dated Apr. 23, 2020, issued in U.S. Appl. No. 15/880,266.
U.S. Office Advisory Action, dated Jul. 14, 2020, issued in U.S. Appl. No. 15/880,266.
U.S. Office Action dated Sep. 24, 2020 issued in U.S. Appl. No. 15/880,266.
U.S. Notice of Allowance dated Mar. 10, 2021 issued in U.S. Appl. No. 15/880,266.
U.S. Office Action, dated May 8, 2017, issued in U.S. Appl. No. 14/458,161.
U.S. Notice of Allowance, dated Aug. 31, 2017, issued in U.S. Appl. No. 14/458,161.
U.S. Office Action, dated Jul. 10, 2019, issued in U.S. Appl. No. 15/793,506.
U.S. Notice of Allowance, dated Oct. 28, 2019, issued in U.S. Appl. No. 15/793,506.
U.S. Office Action, dated Feb. 17, 2016, issued in U.S. Appl. No. 14/520,070.
U.S. Final Office Action, dated Jun. 28, 2016, issued in U.S. Appl. No. 14/520,070.
U.S. Notice of Allowance, dated Aug. 17, 2016, issued in U.S. Appl. No. 14/520,070.
U.S. Notice of Allowance, dated Nov. 23, 2016, issued in U.S. Appl. No. 14/520,070.
U.S. Office Action, dated Jan. 24, 2019, issued in U.S. Appl. No. 15/351,882.
U.S. Notice of Allowance, dated Jul. 10, 2019, issued in U.S. Appl. No. 15/351,882.
U.S. Office Action, dated Jun. 14, 2016, issued in U.S. Appl. No. 14/592,820.
U.S. Final Office Action, dated Nov. 28, 2016, issued in U.S. Appl. No. 14/592,820.
U.S. Office Action, dated May 11, 2017, issued in U.S. Appl. No. 14/592,820.
U.S. Notice of Allowance, dated Nov. 25, 2019, issued in U.S. Appl. No. 14/592,820.
U.S. Notice of Allowance, dated Jun. 15, 2020, issued in U.S. Appl. No. 14/592,820.
U.S. Office Action, dated Mar. 24, 2020, issued in U.S. Appl. No. 16/384,804.
U.S. Final Office Action dated Sep. 29, 2020 issued in U.S. Appl. No. 16/384,804.
U.S. Notice of Allowance dated Jan. 13, 2021 issued in U.S. Appl. No. 16/384,804.
U.S. Notice of Allowance, dated Jul. 3, 2017, issued in U.S. Appl. No. 15/054,023.
U.S. Notice of Allowance [Supplemental Notice of Allowability], dated Jul. 19, 2017, issued in U.S. Appl. No. 15/054,023.
U.S. Notice of Allowability dated Sep. 7, 2017, issued in U.S. Appl. No. 15/054,023.
U.S. Office Action, dated May 8, 2020, issued in U.S. Appl. No. 15/682,369.
U.S. Final Office Action dated Nov. 2, 2020 issued in U.S. Appl. No. 15/682,369.
U.S. Office Action dated Feb. 5, 2018 issued in U.S. Appl. No. 15/475,021.
U.S. Final Office Action dated Aug. 7, 2018, issued in U.S. Appl. No. 15/475,021.
U.S. Office Action dated Sep. 17, 2019, issued in U.S. Appl. No. 15/798,831.
U.S. Final Office Action dated Jan. 3, 2020 issued in U.S. Appl. No. 15/798,831.

(56) References Cited

OTHER PUBLICATIONS

U.S. Advisory Action dated Mar. 3, 2020 issued in U.S. Appl. No. 15/798,831.
U.S. Office Action dated Apr. 29, 2020 issued in U.S. Appl. No. 15/798,831.
U.S. Notice of Allowance dated Aug. 5, 2020 issued in U.S. Appl. No. 15/798,831.
U.S. Notice of Allowance dated Mar. 26, 2019, issued in U.S. Appl. No. 15/903,86.
Chinese First Office Action dated Nov. 2, 2016 issued in Application No. CN 201510548855.2.
Chinese Second Office Action dated Apr. 21, 2017 issued in Application No. CN 201510548855.2.
Chinese First Office Action dated Dec. 29, 2018 issued in Application No. CN 201710917663.3.
Chinese Second Office Action dated Oct. 8, 2019 issued in Application No. CN 201710917663.3.
Chinese First Office Action dated Dec. 18, 2018 issued in Application No. CN 201710920105.2.
Chinese Second Office Action dated Aug. 26, 2019 issued in Application No. CN 201710920105.2.
Taiwanese First Office Action dated Feb. 20, 2019 issued in Application No. TW 104128248.
Chinese First Office Action dated Aug. 25, 2017 issued in Application No. CN 201510494523.0.
Chinese Second Office Action dated Apr. 20, 2018 issued in Application No. CN 201510494523.0.
Chinese First Office Action dated May 29, 2020 issued in Application No. CN 201811027616.2.
Taiwan First Office Action dated Jan. 17, 2019 issued in Application No. TW 104126021.
Taiwan First Office Action dated Oct. 15, 2019 issued in Application No. TW 108120628.
Japanese First Office Action dated May 28, 2019 issued in Application No. JP 2015-158951.
Chinese First Office Action dated Aug. 25, 2017 issued in Application No. CN 201510546899.1.
Chinese Second Office Action dated Jun. 20, 2018 issued in Application No. CN 201510546899.1.
Chinese Third Office Action dated Jan. 14, 2019 issued in Application No. CN 201510546899.1.
Taiwanese First Office Action dated May 3, 2019 issued in Application No. TW 104128242.
Taiwanese First Office Action dated Apr. 8, 2020 issued in Application No. TW 108145644.
Chinese First Office Action dated Nov. 27, 2017 issued in Application No. CN 201510684338.8.
Chinese Second Office Action dated Aug. 10, 2018 issued in Application No. CN 201510684338.8.
Taiwan First Office Action dated Mar. 6, 2019 issued in Application No. TW 104134288.
Chinese First Office Action dated Oct. 26, 2018 issued in Application No. CN 201710103518.1.
Taiwanese First Office Action dated Jun. 23, 2020 issued in Application No. TW 106105506.
International Search Report and Written Opinion dated Jun. 29, 2018 issued in Application No. PCT/US18/22239.
International Preliminary Report on Patentability dated Oct. 10, 2019 issued in Application No. PCT/US2018/022239.
International Search Report and Written Opinion dated Jun. 24, 2020 issued in Application No. PCT/US2020/019927.
Engelhardt et al. (1988) "Deep Trench Etching Using $CBrF_3$ and $CBrF_3$/Chlorine Gas Mixtures," *Siemens AG*, Otto-Hahn-Ring, 8000 Munich 83, Germany, pp. 48-54.
Jim McVittie "Tutorial on Using RF to Control DC Bias" (2007) found in Web-page "https://nccavs-usergroups.avs.org/wp-content/uploads/PAG2007/PEUG_07_5_Mc Vittie.pdf" Used Only as Evidence. (Year: 2007).
Matsuo (May 1, 1980) "Selective etching of Si relative to $SiO_2$ without undercutting by $CBrF_3$ plasma," *Applied Physics Letters*, 36(9):768-770.
Mantzaris et al., "Radio-Frequency Plasmas in CF 4: Self-consistent modeling of the plasma physics and chemistry," J. Appl. Phys., n(12). Jun. 15, 1995, pp. 6169-6180. (used only as evidence). <URL: https://doi.org/10.1063/1.359143>.
Ohiwa et al. (1990) "SiO2 Tapered Etching Employing Magnetron Discharge," *1990 Dry Process Symposium*, ULSI Research Center, Toshiba Corp., V-3, pp. 105-109.
Ohiwa et al. (Feb. 1992) "SiO2 Tapered Etching Employing Magnetron Discharge of Fluorocarbon Gas," *Jpn. J. Appl. Phys.*, 31(Part 1, 2A): 405-410.
Merriam-Webster Online Dictionary definition: "over" (Accessed Sep. 21, 2020).
JP Office Action dated Feb. 20, 2024 in JP Application No. 2021-549483 with English Translation.
KR Office Action dated Feb. 19, 2024 in KR Application No. 10-2021-7030963 with English translation.
KR Office Action dated Jan. 26, 2024 in KR Application No. 10-2021-7027915 with English translation.
KR Office Action dated Jun. 20, 2023, in application No. KR10-2023-0037281 with English Translation.
TW Office Action dated Sep. 15, 2023, in application No. TW109106392 with English translation.
U.S. Restriction requirement dated Dec. 8, 2023, in U.S. Appl. No. 17/310,318.

* cited by examiner

ION BEAM ETCHING WITH SIDEWALL CLEANING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Magnetic random access memory (MRAM) is a non-volatile memory utilizing a magnetoresistive effect such as tunneling magnetoresistance (TMR). MRAM has as high of an integration density as static random access memory (SRAM) and as much high-speed performance as dynamic random access memory (DRAM). Because MRAM stack materials are highly non-volatile and sensitive to reactive chemistries, ion beam etching techniques are typically employed to etch MRAM stacks.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of ion beam etching. The method includes etching through a plurality of magnetoresistive random access memory (MRAM) layers disposed on a substrate to form patterned MRAM stacks, where the plurality of MRAM layers include one or more magnetic layers and a tunnel barrier layer, and where etching through the plurality of MRAM layers includes ion beam etching (IBE) through at least the tunnel barrier layer. The method further includes forming a gapfill dielectric material in spaces between the patterned MRAM stacks, and performing an IBE trim etch to remove at least some of the gapfill dielectric material and electrically conductive materials deposited on sidewalls of the patterned MRAM stacks.

In some implementations, the gapfill dielectric material is formed to a sufficient depth above an underlayer disposed between the substrate and the plurality of MRAM layers so that performing the IBE trim etch does not cause recess into the underlayer. In some implementations, the sufficient depth above the underlayer is between about 1 nm and about 20 nm above a top surface of the underlayer. In some implementations, forming the gapfill dielectric material in spaces between the patterned MRAM stacks includes depositing the gapfill dielectric material in the spaces between the patterned MRAM stacks and over the patterned MRAM stacks. In some implementations, forming the gapfill dielectric material in spaces between the patterned MRAM stacks includes selectively etching the gapfill dielectric material to an etch depth above the depth of the tunnel barrier layer. In some implementations, the gapfill dielectric material includes silicon nitride, silicon oxide, silicon oxycarbide, germanium oxide, magnesium oxide, germanium nitride, or combinations thereof. In some implementations, operations of etching through the plurality of MRAM layers, forming the gapfill dielectric material, and performing the IBE trim etch are performed without introducing a vacuum break in between operations. In some implementations, ion beam etching through at least the tunnel barrier layer includes applying a first ion beam to the substrate having an energy between about 200 eV and about 10,000 eV, and wherein performing an IBE trim etch includes applying a second ion beam to the substrate having an energy between about 20 eV and about 400 eV. In some implementations, performing an IBE trim etch occurs without etching through an underlayer disposed below the plurality of MRAM layers.

Another aspect involves an apparatus for performing ion beam etching. The apparatus includes an ion beam source chamber, a processing chamber coupled to the ion beam source chamber, and a controller. The controller is configured to provide instructions to perform the following operations: position a substrate in the processing chamber, dispose a plurality of MRAM layers on the substrate, where the plurality of MRAM layers include one or more magnetic layers and a tunnel barrier layer, etch through the plurality of MRAM layers disposed on the substrate to form patterned MRAM stacks, where the etch through the plurality of MRAM layers includes ion beam etching (IBE) through at least the tunnel barrier layer, form a gapfill dielectric material in spaces between the patterned MRAM stacks, and perform an IBE trim etch to remove at least some of the gapfill dielectric material and electrically conductive materials deposited on sidewalls of the patterned MRAM stacks.

In some implementations, the controller configured to provide instructions to form the gapfill dielectric material is further configured to provide instructions to perform the following operation: deposit the gapfill dielectric material in the spaces between the patterned MRAM stacks and over the patterned MRAM stacks. In some implementations, the controller configured to provide instructions to form the gapfill dielectric material is further configured to provide instructions to perform the following operation: selectively etch the gapfill dielectric material to an etch depth above the depth of the tunnel barrier layer. In some implementations, the gapfill dielectric material is formed to a sufficient depth above an underlayer disposed between the substrate and the plurality of MRAM layers so that performing the IBE trim etch does not cause recess into the underlayer.

DETAILED DESCRIPTION

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

Electronic devices use integrated circuits including memory to store data. One type of memory that is commonly used in electronic circuits is DRAM. DRAM stores each bit of data in separate capacitors of an integrated circuit. The capacitors can either be charged or discharged, representing two states of a bit. The electric charge of the capacitors slowly leaks off, so data is gradually lost unless capacitor charge is refreshed periodically. DRAM is a type of volatile memory, in contrast to non-volatile memory, since data is lost when power is removed.

Unlike conventional RAM chip technologies, data in MRAM is not stored as electric charge or current flows, but by magnetic storage elements. The magnetic storage elements may be formed from two ferromagnetic plates, each of which can hold a magnetization, separated by a thin non-magnetic insulating layer. One of the two ferromagnetic plates may be a permanent magnet set to a certain polarity, and the other one of the two ferromagnetic plates may be changed to match that of an external field to store memory. Such a configuration involving the two ferromagnetic plates and the thin non-magnetic insulating layer is known as a magnetic tunnel junction. MRAM is a type of non-volatile memory because it has the capability of holding saved data even if power is removed.

Figure 1:
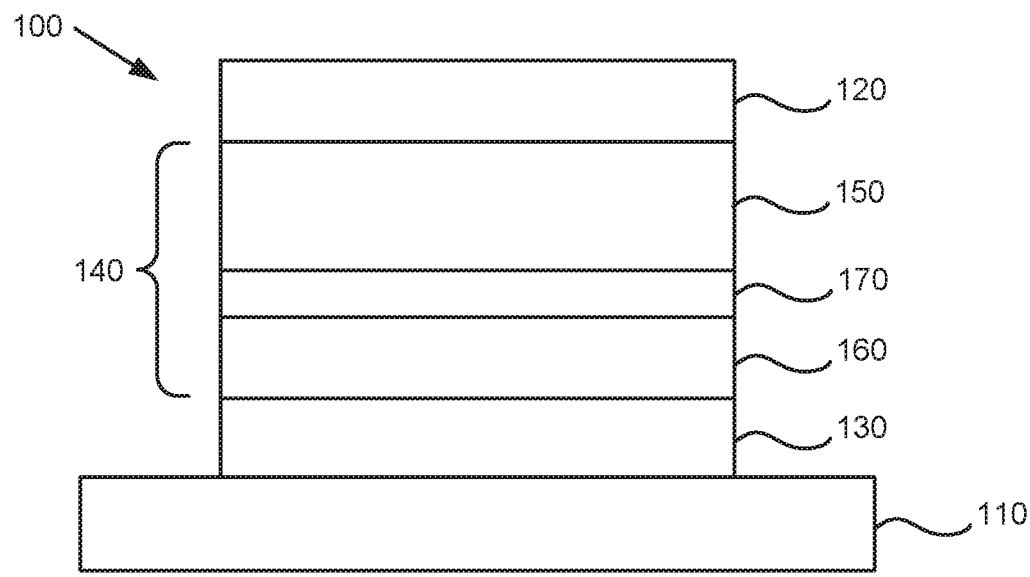
FIG. 1 is a cross-sectional schematic illustration of an example MRAM stack on a substrate according to some implementations.

FIG. 1 is a cross-sectional schematic illustration of an example MRAM stack on a substrate according to some implementations. An MRAM stack 100 is disposed on a dielectric layer 110, for instance SiO2, which is deposited onto a silicon or glass substrate (not shown). In the case of embedded MRAM, there are various structures (not shown) including the transistor level of the logic circuit as well as 3 to 5 metallization layers between the substrate and the MRAM stack 100, since embedded MRAM may be MRAM that is embedded in non-memory circuitry such as metallization layers. These structures are all covered by or interposed within the dielectric layer 110. The MRAM stack 100 can include a top electrode layer 120 and a bottom electrode layer 130. The bottom electrode layer 130 is disposed over the dielectric layer 110 and can include a single layer metal or a multi-layer stack comprising multiple metal layers and other material layers (e.g., dielectric materials). The top electrode layer 120 is disposed over the bottom electrode layer 130 and can include a single layer metal or a multi-layer stack comprising multiple metal layers and other material layers (e.g., dielectric materials). The MRAM stack 100 may be arranged in an array of MRAM cells connected by metal word and bit lines. In some implementations, the bottom electrode layer 130 is connected to a word line and the top electrode layer 120 is connected to a bit line.

The MRAM stack 100 may include a memory element or magnetoresistive effect element, where the memory element or magnetoresistive effect element may be disposed between the top electrode layer 120 and the bottom electrode layer 130. The memory element or the magnetoresistive effect element may be a multi-layer film or magnetic tunnel junction (MTJ) stack 140. The MTJ stack 140 may include magnetic layers 150, 160 with a barrier layer 170 between the magnetic layers 150, 160. Furthermore, the MTJ stack 140 may include multiple MTJ stacks and multiple barrier layers, each barrier layer positioned between a pair of magnetic layers. It will be understood that the MTJ stack 140 is illustrative and not restrictive, and can include many other layers not shown in FIG. 1. A first magnetic layer 150 is designed to serve as a free magnetic layer while a second magnetic layer 160 has a fixed magnetization direction. In some implementations, each of the first magnetic layer 150 and the second magnetic layer 160 includes a magnetic material such as cobalt (Co), nickel (Ni), iron (Fe), or combinations thereof (e.g., CoNi, CoFe, NiFe, CoNiFe). Each of the first magnetic layer 150 and the second magnetic layer 160 may further include a non-magnetic material such as boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (O), nitrogen (N), carbon (C), platinum (Pt), palladium (Pd), ruthenium (Ru), or phosphorus (P) to form a magnetic compound (e.g., CoFeB). It will be appreciated that each of the first magnetic layer 150 and the second magnetic layer 160 may include one or more sub-layers. In some implementations, the second magnetic layer 160 may be coupled to and disposed over an anti-ferromagnetic layer (not shown). The MTJ stack 140 further includes a tunnel barrier layer or barrier layer 170 between the first magnetic layer 150 and the second magnetic layer 160, where the barrier layer 170 can include non-magnetic insulating material such as magnesium oxide (MgO). Thus, the MTJ stack 140 can include a pair of ferromagnetic layers (i.e., first magnetic layer 150 and second magnetic layer 160) with a non-magnetic intermediate layer (i.e., barrier layer 170) therebetween, which collectively produces a magnetoresistive effect. The resistivity of the MTJ stack 140 changes when the magnetization of the first magnetic layer 150 changes direction relative to that of the second magnetic layer 160, exhibiting a low resistance state when the magnetization orientation of the pair of ferromagnetic layers is substantially parallel and a high resistance state when the magnetization orientation of the pair of ferromagnetic layers is substantially anti-parallel. Therefore, the MRAM stack 100 can have two stable states to allow the MRAM stack 100 to serve as non-volatile memory.

In some implementations, the top electrode layer 120 can serve as a hard mask layer. During processing, the top electrode layer 120 can be deposited on the first magnetic layer 150 to pattern the underlying MTJ stack 140. It will be appreciated, however, that the position of the first magnetic layer 150 and the second magnetic layer 160 may be reversed so that the top electrode layer 120 is deposited on the second magnetic layer 160. In some implementations, the top electrode layer 120 includes tungsten (W), tantalum (Ta), tantalum nitride (TaN), titanium nitride (TiN), or other refractory metals. The MTJ stack 140 may be formed on the bottom electrode layer 130, where the bottom electrode layer 130 includes an electrically conductive material such as Ta, Ti, W, TiN, TaN, Pt, Ru, or the like.

It will be appreciated that the MRAM stack 100 may include several other layers not necessarily shown in FIG. 1. The layers in the MRAM stack 100 are not necessarily limited to metal or electrically conductive materials, but may include one or more layers of dielectric materials as well.

Etching materials in MRAM stacks, including an MRAM stack 100 in FIG. 1, can present many challenges. Hard materials are commonly etched with a chemical etching process such as reactive ion etching (RIE). However, reactive ion etching of materials such as cobalt, iron, nickel, and other magnetic elements is difficult because such materials do not readily become volatile when exposed to typical etchant chemistries. Thus, many materials in MRAM stacks require more aggressive etchant chemistries. On the other hand, certain materials in MRAM stacks cannot tolerate such aggressive etchant chemistries. For example, a tunnel barrier layer such as MgO cannot tolerate reactive chemistries, where reactive chemistries can include radicals, ions, and neutral species containing fluorine, chlorine, iodine, oxygen, or hydrogen. These chemistries can cause a reaction with the tunnel barrier layer, thereby damaging the tunnel barrier layer and adversely impacting the electrical and magnetic properties of the MRAM stack. In some instances, the tunnel magnetoresistance (TMR) effect in the MRAM stack is compromised.

Ion beam etching (IBE) has been widely used in various industries for patterning thin films. Ion beam etching, which can also be referred to as ion milling, provides a highly-directional beam of charged particles to etch features on a substrate. Ion beam etching can be applied using inert gas for a purely physical etching process, though in some instances, ion beam etching can be applied using reactive species to increase material etching with a chemical/reactive component. Generally speaking, ion beam etching can physically etch through hard materials by using individual particles to ablate an exposed target to dislodge atoms and molecules. Ion beam etching can be used to etch materials in MRAM stacks while avoiding reactive chemistries that can otherwise degrade sensitive layers like the tunnel barrier layer.

Features in MRAM stacks can be patterned with ion beam etching. Ion beam etching may be generally free of chemical reactions and will physically etch layers and materials exposed by a hard mask. This causes atoms and molecules to be sputtered from a target. The sputtered atoms and molecules may be directed towards exposed sidewalls of MRAM stacks and result in re-deposition on the exposed sidewalls. Accordingly, etching and re-deposition may occur simultaneously. Re-deposited materials may be cleaned from sidewalls of MRAM stacks by performing ion beam etching at lower energies and different impact angles than ion beam etching to pattern the MRAM stacks.

Figure 2:
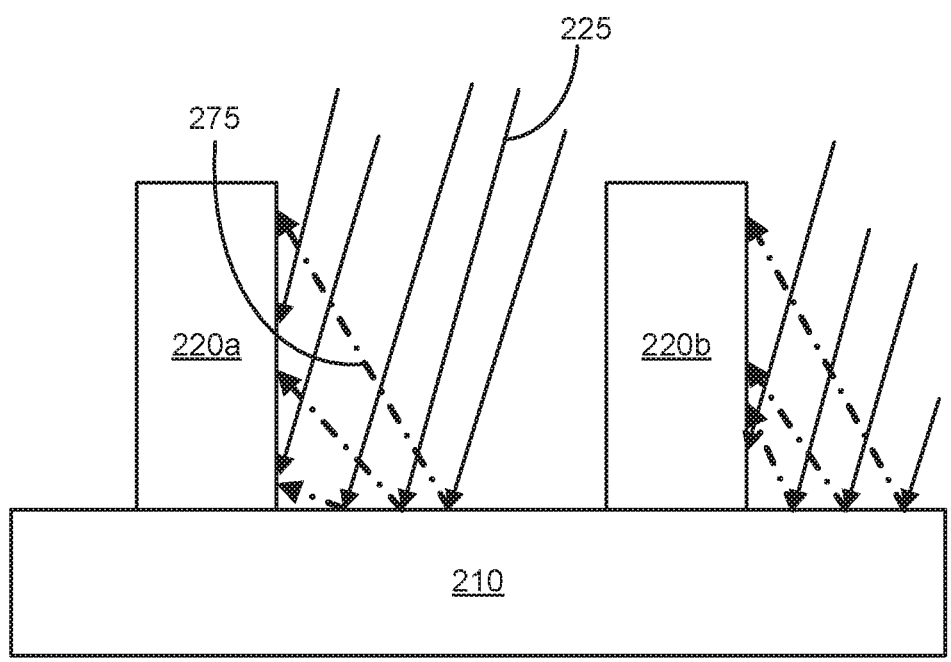
FIG. 2 is a cross-sectional schematic illustration of MRAM layers undergoing ion beam etching (IBE) and sidewall re-deposition.

FIG. 2 is a cross-sectional schematic illustration of MRAM layers undergoing ion beam etching and sidewall re-deposition. MRAM stacks 220a, 220b are formed on a substrate 210. Each of the MRAM stacks 220a, 220b may include a pair of magnetic layers, where a tunnel barrier layer (e.g., MgO) may be sandwiched between the magnetic layers. It will be appreciated that in some implementations, each of the MRAM stacks 220a, 220b may include multiple tunnel barrier layers that are each sandwiched between a pair of magnetic layers. Examples of layers and materials in the MRAM stacks 220a, 220b are described above with respect to the MRAM stack 100 in FIG. 1. A conventional MRAM patterning process includes hard mask patterning, top electrode patterning, MTJ patterning, and bottom electrode patterning. It will be appreciated that ion beam etching may be used in some or all of the aforementioned patterning processes, where ion beam etching may be used in MTJ patterning. Reactive ion etching or ion beam etching may be used in top electrode patterning and bottom electrode patterning. To pattern the MRAM stacks 220a, 220b, an ion beam 225 may be applied to the substrate 210 to physically etch layers and materials exposed by a hard mask. The ion beam 225 causes atoms and molecules to be sputtered from surfaces exposed to the ion beam 225. As shown in FIG. 2, sputtered atoms and molecules 275 may be directed towards the sidewalls of the MRAM stacks 220a, 220b and re-deposited on the sidewalls. Some of the layers on the substrate 210, such as layers of the MTJ stack, may include metal atoms such as Fe, Co, and Ni atoms. As ion beam etching proceeds through the MTJ stack, such metal atoms may be dislodged and re-deposited on the sidewalls of the MRAM stacks 220a, 220b. When a conductive material is re-deposited on sidewalls of the tunnel barrier layer, which may be only a few nanometers thick, the magnetic layers are shorted in the MRAM stacks 220a, 220b.

The ion beam 225 applied to the substrate 210 may be directed at an angle. An angle of incidence of the ion beam 225 may be adjusted to control parameters such as etch rates, uniformity, shapes, topography, and composition of target surfaces. In some instances, the angle of incidence of the ion beam 225 is adjusted to clean sidewalls of re-deposited materials. A lower angle of incidence (i.e., more vertical) of the ion beam 225 can lead to more re-deposition of materials, whereas an optimized higher angle of incidence (i.e., less vertical) of the ion beam 225 can lead to cleaner sidewall surfaces by removing re-deposited materials. Furthermore, as device density increases and aspect ratios increase, the feasibility of using higher incident angles in cleaning sidewall surfaces becomes more limited.

Ion Beam Etching Apparatus

Figure 3:
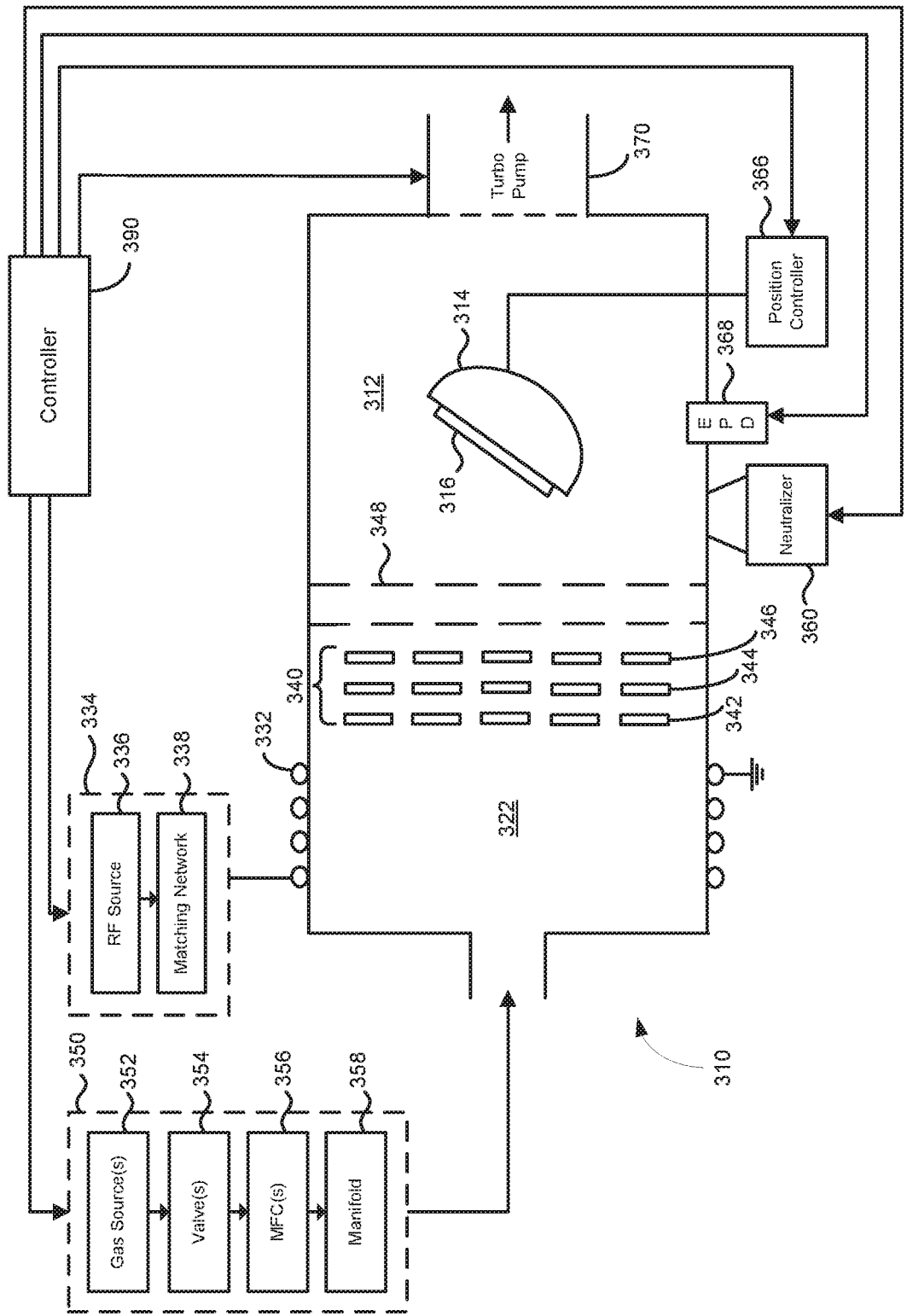
FIG. 3 is a schematic diagram of an example ion beam etching apparatus according to some implementations.

FIG. 3 is a schematic diagram of an example ion beam etching apparatus according to some implementations. An ion beam etching apparatus 310 includes a processing chamber 312 with a substrate holder 314 for supporting a substrate 316. The substrate 316 may be a semiconductor wafer. A plurality of MRAM layers as described earlier may be formed on the substrate 316. The plurality of MRAM layers may include one or more magnetic layers and a tunnel barrier layer or multiple tunnel barrier layers. The plurality of MRAM layers may further include a top electrode layer and a bottom electrode layer. The substrate 316 may be attached to the substrate holder 314 using any suitable technique. For example, the substrate 316 is mechanically or electrostatically connected to the substrate holder 314. In some implementations, the substrate holder 314 provides precise tilting and rotation and may include an electrostatic chuck (ESC) to engage the substrate 316.

The ion beam etching apparatus 310 further includes an ion beam source chamber 322, where the processing chamber 312 may be outside of and coupled to the ion beam source chamber 322. The ion beam source chamber 322 may be separated from the processing chamber 312 by an ion extractor 340 and/or mechanical shutter 348. An inductive coil 332 may be arranged around an outer wall of the ion beam source chamber 322. A plasma generator 334 supplies RF power to the inductive coil 332. The plasma generator 334 may include an RF source 336 and a matching network 338. In use, a gas mixture is introduced to the ion beam source chamber 322 and RF power is supplied to the inductive coil 332 to generate plasma in the ion beam source chamber 322, where the plasma produces ions.

The ion beam etching apparatus 310 further includes a gas delivery system 350 that is fluidly coupled to the ion beam source chamber 322. The gas delivery system 350 delivers one or more gas mixtures to the ion beam source chamber 322. The gas delivery system 350 may include one or more gas sources 352, valve(s) 354, mass flow controller(s) (MFCs) 356, and a mixing manifold 358 that are in fluid communication with the ion beam source chamber 322. In some implementations, the gas delivery system 350 is configured to deliver an inert gas such as, helium (He), neon (Ne), argon (Ar), xenon (Xe), or krypton (Kr). In some implementations, the gas delivery system 350 delivers gas mixtures that further include reactive chemistries along with the inert gas.

The ion extractor 340 extracts positive ions from the plasma and accelerates the positive ions in a beam towards the substrate 316. The ion extractor 340 may include a plurality of electrodes that form a grid or grid system. As shown in FIG. 3, the ion extractor 340 includes three electrodes, where a first electrode 342, a second electrode 344, and a third electrode 346 are present in that order from the gas delivery system 350. A positive voltage is applied to the first electrode 342 and a negative voltage is applied to the second electrode 344 so that ions are accelerated due to a difference in their potentials. The third electrode 346 is grounded. A difference in potentials between the second electrode 344 and the third electrode 346 is controlled to control the energy and divergence of the ion beam. A mechanical shutter 348 may be adjacent to the ion extractor 340. A neutralizer 360 may supply electrons into the processing chamber 312 to neutralize the charge of the ion beam passing through the ion extractor 340 and the mechanical shutter 348, where the neutralizer 360 may have its own gas delivery system using an inert gas such as argon or xenon. In some implementations, the ion extractor 340 and/or mechanical shutter 348 may be controlled to cause the ion beam to be delivered to the substrate 316 continuously or in pulses.

A position controller 366 may be used to control a position of the substrate holder 314. In particular, the position controller 366 can control a tilt angle about a tilt axis and rotation of the substrate holder 314 to position the substrate 316. In some implementations, an endpoint detector 368 may be used to sense a location of the ion beam relative to the substrate 316 and/or substrate holder 314. A pump 370 such as a turbomolecular pump may be used to control pressure in the processing chamber 312 and evacuate reactants from the processing chamber 312.

The ion beam etching apparatus 310 may further include a controller 390. The controller 390 (which may include one or more physical or logical controllers) controls some or all of the operations of the ion beam etching apparatus 310. In some implementations, the controller 390 may be used to control the plasma generator 334, the gas delivery system 350, the neutralizer 360, the position controller 366, and the pump 370. The controller 390 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller 390 they may be provided over a network. In certain implementations, the controller 390 executes system control software. The system control software may include instructions for controlling the timing of application and/or magnitude of any one or more of the following chamber operational conditions: the mixture and/or composition of gases, flow rates of gases, chamber pressure, chamber temperature, substrate/substrate holder temperature, substrate position, substrate holder tilt, substrate holder rotation, voltage applied to a grid, the frequency and power applied to coils or other plasma generation components, and other parameters of a particular process performed by the tool. The system control software may further control purge operations and cleaning operations through the pump 370. System control software may be configured in any suitable way. For example, various process tool component subroutines or control objects may be written to control operations of the process tool components necessary to carry out various process tool processes. System control software may be coded in any suitable compute readable programming language.

In some implementations, system control software includes input/output control (IOC) sequencing instructions for controlling the various parameters described above. For example, each phase of a semiconductor fabrication process may include one or more instructions for execution by the controller 390. The instructions for setting process conditions for a phase may be included in a corresponding recipe phase, for example. In some implementations, the recipe phases may be sequentially arranged, such that steps in an ion beam etching process are executed in a certain order for that process phase. For example, a recipe may be configured to perform a separation etch using ion beam etching at high energies and a trim etch using ion beam etching at low energies.

Other computer software and/or programs may be employed in some implementations. Examples of programs or sections of programs for this purpose include substrate positioning program, a process gas composition control program, a pressure control program, a heater control program, and an RF power supply control program.

The controller 390 may control these and other aspects based on sensor output (e.g., when power, potential, pressure, gas levels, etc. reach a certain threshold), the timing of an operation (e.g., opening valves at certain times in a process), or based on received instructions from the user.

Broadly speaking, the controller 390 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 390 in the form of various individual settings (or program files), defining operational parameters for carrying out a particular process on or for a semiconductor substrate or to a system. The operational parameters may, in some implementations, be part of a recipe defined by process engineers to accomplish one or more processing steps during the patterning of MRAM stacks on a substrate.

The controller 390, in some implementations, may be a part of or coupled to a computer that is integrated with, coupled to the system, otherwise networked to the system, or a combination thereof. For example, the controller 390 may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 390 receives instructions in the form of data, which specify parameters for each of the processing steps to be performed during one or more operations. It should be understood that the parameters may be specific to the type of process to be performed and the type of tool that the controller 390 is configured to interface with or control. Thus as described above, the controller 390 may be distributed, such as by comprising one or more discrete controllers that are networked together and working towards a common purpose, such as the processes and controls described herein. An example of a distributed controller 390 for such purposes would be one or more integrated circuits on a chamber in communication with one or more integrated circuits located remotely (such as at the platform level or as part of a remote computer) that combine to control a process on the chamber.

As noted above, depending on the process step or steps to be performed by the tool, the controller 390 might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory. Examples of the foregoing are described in FIGS. 7-9 that the controller 390 might communicate with.

Ion Beam Etching with Sidewall Cleaning

In the present disclosure, dielectric gapfill material is deposited in between an IBE separation etch process for patterning MRAM stacks and an IBE trim etch process for cleaning sidewalls of patterned MRAM stacks. Typically, an IBE trim etch process for cleaning sidewalls of patterned MRAM stacks causes sputtering of metals or electrically conductive materials that can be re-deposited on the sidewalls. Sputtering of metals or electrically conductive materials can occur where the etch front for the IBE trim etch process contains metals or electrically conductive materials. One approach to avoid such sputtering is to provide a thick layer of dielectric material such as silicon oxide ($SiO_2$) as the etch front. The thick layer of dielectric material may be provided underlying MRAM layers or underlying magnetic layers in an MTJ stack. The thick layer of dielectric material may be at least about 40 nm thick, at least about 50 nm thick, at least about 75 nm thick, or at least about 100 nm thick. That way, any materials that get re-deposited on sidewalls during ion beam etching are dielectric materials rather than electrically conductive materials. However, providing a thick layer of dielectric material underlying magnetic layers in an MTJ stack may be impractical, increase operational overhead, complicate manufacturing processes, increase costs, and even undermine performance. For example, many MRAM devices are embedded memories that reside between metallization layers in an integrated circuit (IC), and thicknesses of dielectric layers where the MRAM devices reside may not be easily changed.

Figure 4A:
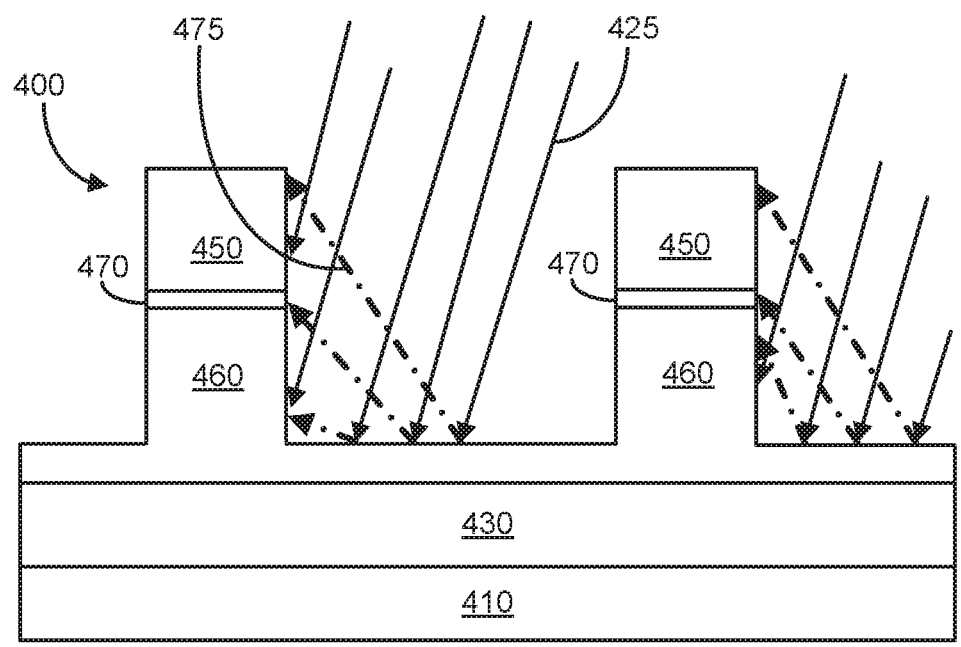
FIGS. 4A and 4B show cross-sectional schematic illustrations of ion beam etching through a plurality of MRAM layers and an underlayer.
Figure 4B:
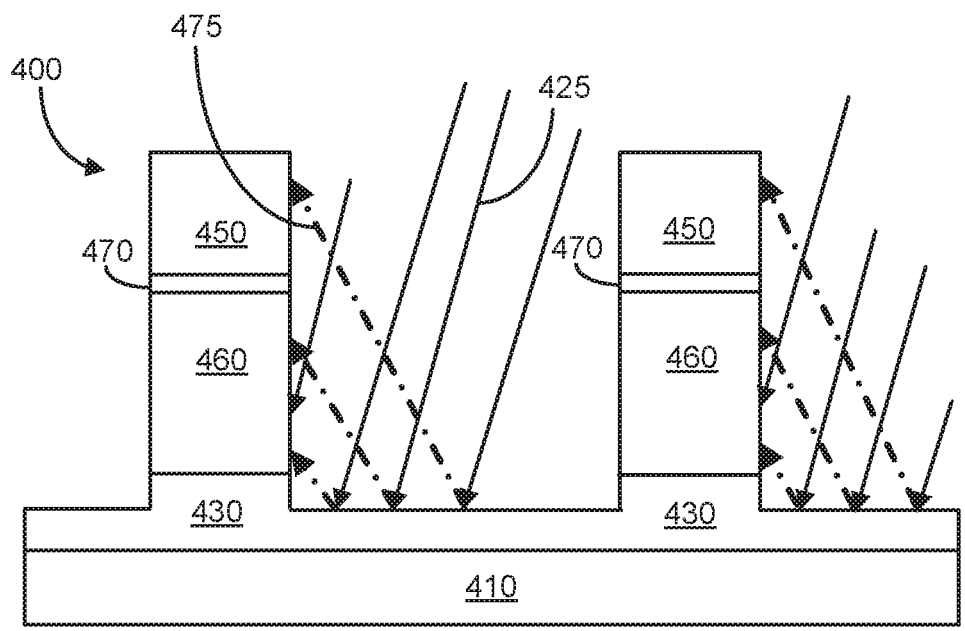

FIGS. 4A and 4B show cross-sectional schematic illustrations of ion beam etching through a plurality of MRAM layers and an underlayer. An MRAM stack 400 may include a first magnetic layer 450, a tunnel barrier layer 470, and a second magnetic layer 460, where the tunnel barrier layer 470 is between the first magnetic layer 450 and the second magnetic layer 460. The first magnetic layer 450 may also be referred to as a free layer and is designed to serve as a free magnetic layer, and the second magnetic layer 460 may be referred to as a reference layer and is designed to have a fixed magnetization direction. In some implementations, the first magnetic layer 450 and the second magnetic layer 460 may include magnetic materials such as Co, Ni, Fe, Pt, or combinations thereof. The tunnel barrier layer 470 may include a non-magnetic insulating material such as MgO. The combination of the first magnetic layer 450, the tunnel barrier layer 470, and the second magnetic layer 460 produces a magnetoresistive effect. The MRAM stack 400 is disposed over a substrate 410 with an underlayer 430 between the substrate 410 and the MRAM stack 400. The underlayer 430 may include one or more layers of dielectric materials such as silicon oxide ($SiO_2$). In some implementations, a hard mask layer or an electrode layer (not shown) may be disposed over the MRAM stack 400. In some implementations, an electrode layer (not shown) may be disposed between the underlayer 430 and the substrate 410. In some implementations, the MRAM stack 400 may include multiple tunnel barrier layers each sandwiched between a first magnetic layer and a second magnetic layer.

Ion beam etching through the layers of the MRAM stack 400 may be performed to form patterned MRAM stacks, where the patterned MRAM stacks can include lines, pillars, or other patterned features. Ion beam etching to form patterned MRAM stacks may be performed at high power and a relatively low angle of incidence. In addition, ion beam etching may be performed to clean sidewalls of the patterned MRAM stacks in order to remove unwanted materials re-deposited on the sidewalls after forming the patterned MRAM stacks. Ion beam etching to clean sidewalls of the patterned MRAM stacks may be performed at a lower power and a relatively high angle of incidence from a substrate surface normal.

In FIG. 4A, an ion beam 425 may be directed at an angle to clean sidewalls of patterned MRAM stacks. For example, the substrate 410 may be tilted or rotated to adjust the ion impact angle of the ion beam 425. The ion beam 425 impacts sidewalls of the patterned MRAM stacks to remove unwanted materials. The ion beam 425 also impacts a bottom surface of the MRAM stack 400 and causes atoms and molecules at the bottom surface to be sputtered. Sputtered atoms and molecules 475 may be directed towards sidewalls of the patterned MRAM stacks, which results in re-deposition on the sidewalls of the patterned MRAM stacks. When an etch front for the ion beam 425 has electrically conductive materials (e.g., metals), at least some of the electrically conductive materials may be re-deposited on the sidewalls of the patterned MRAM stacks. In FIG. 4A, when the etch front for the ion beam 425 includes the second magnetic layer 460, magnetic elements having Co, Ni, Pt, or Fe may be re-deposited on sidewalls of the patterned MRAM stacks, which can degrade the electrical and magnetic performance of the MRAM stack 400.

Rather than having an etch front of electrically conductive materials, the etch front may include dielectric materials. In FIG. 4B, the ion beam 425 impacts the bottom surface of the MRAM stack 400 and causes sputtered atoms and molecules 475 to be directed towards exposed surfaces of the patterned MRAM stacks. The etch front for the ion beam 425 includes the underlayer 430, where dielectric materials such as $SiO_2$ can be re-deposited on sidewalls of the patterned MRAM stacks. Sputtered atoms and molecules 475 from the dielectric materials in the underlayer 430 are not likely to degrade the electrical and magnetic performance of the MRAM stack 400. Thus, overetch can be performed through the underlayer 430 while rendering any backsputtering harmless to the patterned MRAM stacks. The thickness of the underlayer 430 may be sufficient to serve as an etch front for ion beam etching to adequately clean sidewalls of the patterned MRAM stack. However, as discussed above, it may be undesirable to incorporate a sufficiently thick underlayer 430 between the substrate 410 and the MRAM stack 400, and particularly having a thick underlayer 430 may be impractical in various devices.

In the present disclosure, an underlayer having dielectric materials, with sufficient thickness to allow removal of the re-deposited sidewall material before the dielectric materials are etched away, is not provided with the MRAM stacks to serve as an etch front during cleaning. In the present disclosure, an IBE main etch process is performed to form patterned MRAM stacks followed by deposition of a gapfill dielectric material in spaces between the patterned MRAM stacks. The gapfill dielectric material may be etched back or otherwise formed to a sufficient depth such that the deposited gapfill dielectric material remains throughout all or most of a subsequent IBE trim etch cleaning step. In some implementations, the deposited gapfill dielectric material thickness extends above a depth of a tunnel barrier layer. An IBE overetch or trim etch process is performed to clean sidewalls of the patterned MRAM stacks following the deposition of the gapfill dielectric material, where the etch front during the IBE trim etch process includes the gapfill dielectric material.

Figure 5:
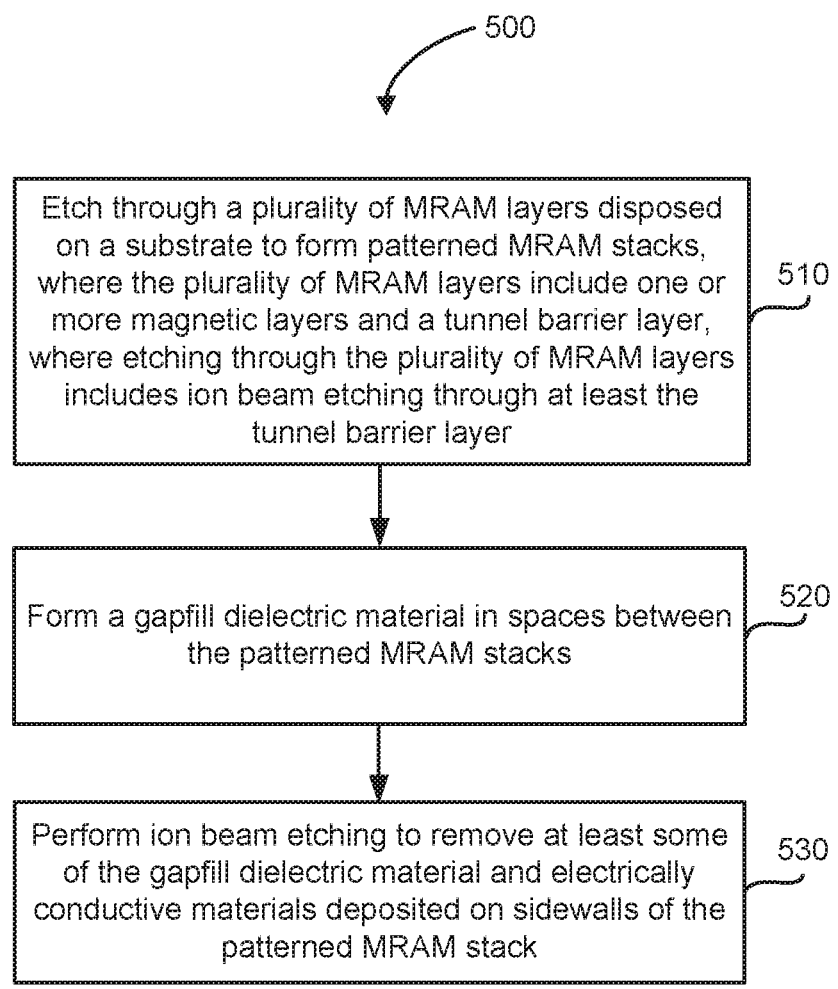
FIG. 5 shows a flow diagram of an example method of ion beam etching according to some implementations.

FIG. 5 shows a flow diagram of an example method of ion beam etching according to some implementations. Operations of a process 500 in FIG. 5 may include additional, fewer, or different operations. Accompanying the description of the process 500 in FIG. 5 is a series of cross-sectional schematic illustrations showing a main etch, gapfill, planarization, etchback, IBE trim etch, and encapsulation operations in FIGS. 6A-6F. The operations of the process 500 may be performed using an ion beam etching apparatus such as the ion beam etching apparatus 310 in FIG. 3.

At block 510 of the process 500, a plurality of MRAM layers disposed on a substrate are etched through to form patterned MRAM stacks, where the plurality of MRAM layers include one or more magnetic layers and a tunnel barrier layer. Etching through the plurality of MRAM layers includes ion beam etching (IBE) through at least the tunnel barrier layer. In some implementations, etching through the plurality of MRAM layers includes ion beam etching through the plurality of MRAM layers. In some implementations, etching through the plurality of MRAM layers includes reactive ion etching (RIE) through some of the plurality of MRAM layers and ion beam etching through at least the tunnel barrier layer. In some implementations, the plurality of MRAM layers includes two or more tunnel barrier layers, where ion beam etching is performed through the two or more tunnel barrier layers. A hard mask may be formed on the plurality of MRAM layers for patterning the MRAM stacks. The hard mask can be made from, for example, W, Ti, Ta, TiN, or other refractory metals. Etching through the plurality of MRAM layers at block 510 may also be referred to as a "main etch," "cut etch," "separation etch," "first etch," or "IBE separation etch."

Etching through the plurality of MRAM layers may include etching through the MTJ stack that includes a first magnetic layer, a second magnetic layer, and the tunnel barrier layer that is between the first magnetic layer and the second magnetic layer. The first magnetic layer may be positioned above the tunnel barrier layer and the second magnetic layer may be positioned below the tunnel barrier layer. The tunnel barrier layer may include a non-magnetic insulating material such as MgO. Each of the first magnetic layer and the second magnetic layer may include magnetic elements such as Co, Ni, Pt, Fe, or combinations thereof. In some implementations, etching through the MTJ stack(s) may include ion beam etching through the MTJ stack(s). Etching may be stopped at an underlayer or a dielectric layer after etching through at least the second magnetic layer. Etching through the plurality of MRAM layers may include ion beam etching through the first magnetic layer, the tunnel barrier layer, and the second magnetic layer without etching through the underlayer. Thus, the main or separation etch may be performed up to an interface between the underlayer and the plurality of MRAM layers being etched, where the underlayer can include a dielectric material such as $SiO_2$. The main etch may be performed to a top surface of the underlayer, where the main etch may stop on the underlayer using optical emission spectroscopy or an endpoint detector.

When ion beam etching through at least some of the MRAM layers, an ion beam of an inert gas may be generated from an ion beam source chamber. The ion beam source chamber may be coupled to a processing chamber in which the substrate is located. The ion beam may be generated in the ion beam source chamber using a gas mixture including the inert gas. The inert gas may include helium (He), neon (Ne), argon (Ar), xenon (Xe), krypton (Kr), or combinations thereof. In some implementations, the gas mixture may include one or more reactive gases to increase material etching with a chemical/reactive component. In some implementations, the gas mixture is free of or substantially free of reactive gases. RF power may be applied to coils surrounding the ion beam source chamber to generate plasma, and ions are extracted from the plasma to form an ion beam. A voltage is applied to an ion extractor (e.g., grid) to extract ions to form the ion beam, and the ion beam may be accelerated towards the processing chamber. Controlling the voltage applied to the ion extractor may be used to control an etch rate when performing ion beam etching. A high voltage ion beam may be between about 400 V and about 2000 V for performing a "fast" etch at a high etch rate, and a low voltage ion beam may be between about 30 V and about 400 V for performing a "soft" etch at a low etch rate. Ion beam etching (main etch or separation etch) through at least some of the plurality of MRAM layers, including the tunnel barrier layer, to form the patterned MRAM stacks may be performed at relatively high voltages. Accordingly, the main etch used to etch through the plurality of MRAM layers to form patterned MRAM stacks may be performed at high voltages between about 400 V and about 2000 V. On the other hand, the trim etch or overetch used to clean sidewalls of patterned MRAM stacks may be performed at low voltages between about 30 V and about 400V.

In some implementations, etching through at least some of the plurality of MRAM layers may include applying an ion beam to the substrate having ion energies between about 200 eV and about 10,000 eV. The main etch may be performed at high ion energies to efficiently etch materials in the MRAM layers compared to a trim etch. In some implementations, the main or separation etch can be performed in 10 minutes or less, 3 minutes or less, or 1 minute or less. In some implementations, the main etch can be performed in an ion beam etching apparatus having an ion beam source chamber coupled to a processing chamber. An example ion beam etching apparatus is described in FIG. 3 above.

In some implementations, some of the MRAM layers may be etched using reactive ion etching. Specifically, reactive ion etching may be applied to layers other than the tunnel barrier layer since reactive species from reactive ion etching may damage the tunnel barrier layer. Ion beam etching may be performed subsequent to reactive ion etching to etch through the tunnel barrier layer. In some implementations, reactive ion etching may be applied to a hard mask layer or electrode layer disposed over the tunnel barrier layer. In some implementations, reactive ion etching may be applied to the first magnetic layer disposed above the tunnel barrier layer. In some implementations, reactive ion etching may be applied to the second magnetic layer disposed below the tunnel barrier layer. In some implementations, reactive ion etching may be applied to an electrode layer disposed below the second magnetic layer. Notwithstanding, any of the aforementioned MRAM layers may be etched using with ion beam etching rather than reactive ion etching. Thus, a sequence for the main etch in etching through the plurality of MRAM layers may include RIE followed by IBE, RIE followed by IBE and followed by RIE, IBE followed by RIE, or IBE throughout.

The main etch may result in re-deposition of electrically conductive materials on sidewalls of the patterned MRAM stacks. The re-deposited electrically conductive materials may come from one or more magnetic layers in the plurality of MRAM layers. Typically, in etching the one or more magnetic layers of the plurality of MRAM layers, etch byproducts are produced that may be re-deposited on exposed surfaces. The etched byproducts may include atoms or molecules of metals or electrically conductive materials. These etch byproducts are sputtered when an ion beam is applied to the plurality of MRAM layers. The one or more magnetic layers may include non-volatile materials, where the non-volatile materials may include magnetic materials such as Co, Ni, Pt, Fe, and the like. When such etch byproducts are re-deposited on sidewall surfaces of the tunnel barrier layer, the MTJ stack is compromised and can lead to shorting.

Etching through the plurality of MRAM layers forms patterned MRAM stacks, where the patterned MRAM stacks are lines, pillars, or other patterned features. The main etch forms spaces between the patterned MRAM stacks. In some implementations, the patterned MRAM stacks are pillars having high aspect ratios, where a height-to-width aspect ratio of a patterned MRAM stack is at least 5:1, at least 7:1, at least 10:1, or at least 20:1. In some implementations, a pitch between adjacent MRAM stacks may be equal to or less than about 300 nm, between about 10 nm and about 300 nm, or between about 30 nm and about 250 nm.

In some implementations, prior to block 510 of the process 500, the substrate may be positioned in a processing chamber of the ion beam etching apparatus. The plurality of MRAM layers may be disposed on the substrate, where the plurality of MRAM layers include the one or more magnetic layers and the tunnel barrier layer.

Figure 6A:
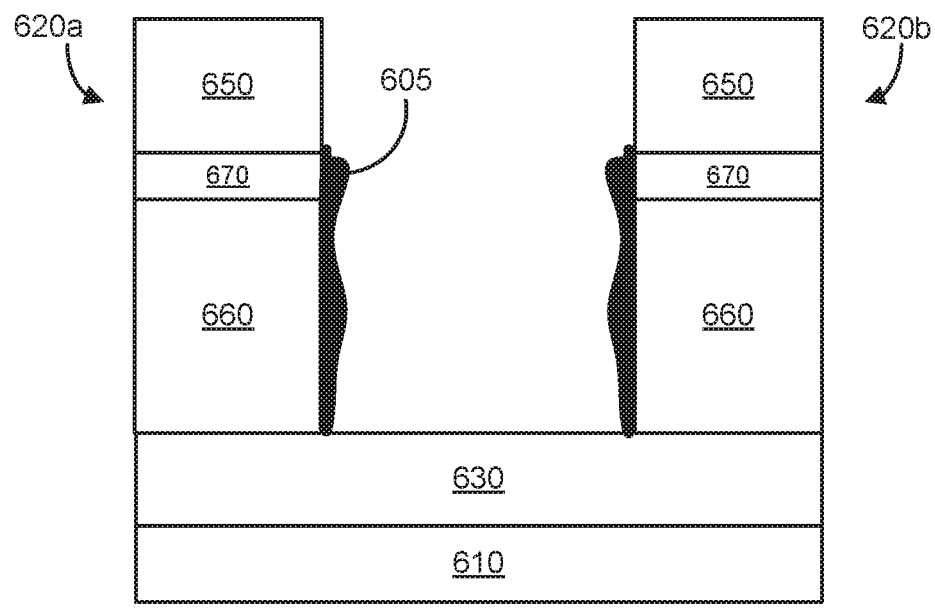
FIGS. 6A-6F show cross-sectional schematic illustrations of a process of performing main etch, gapfill, planarization, etchback, IBE trim etch, and encapsulation operations according to some implementations.

FIG. 6A shows a cross-sectional schematic illustration of an example main etch according to some implementations. A plurality of MRAM layers 650, 660, and 670 are positioned over a substrate 610, and an underlayer 630 is positioned between the plurality of MRAM layers 650, 660, and 670 and the substrate 610. Aspects of the plurality of MRAM layers 650, 660, and 670 and the underlayer 630 are described in FIGS. 1 and 2. The plurality of MRAM layers 650, 660, and 670 include at least a first magnetic layer 650, a second magnetic layer 660, and a tunnel barrier layer 670 in between the first magnetic layer 650 and the second magnetic layer 660. As discussed above, the plurality of MRAM layers 650, 660, and 670 may include multiple tunnel barrier layers each sandwiched between a first magnetic layer and a second magnetic layer. A main etch is performed to form patterned MRAM stacks 620a, 620b. The main etch may stop on a top surface of the underlayer 630. In some implementations, the main or separation etch is performed through at least the tunnel barrier layer 670 in forming the patterned MRAM stacks 620a, 620b. The ion beam of the main or separation etch may be provided at relatively high ion energies and a relatively low angle of incidence to a substrate surface normal. Residue 605 containing metals or electrically conductive materials forms on the sidewalls of the patterned MRAM stacks 620a, 620b as a result of the main etch. Sputtered atoms and/or molecules from ion beam etching of the plurality of MRAM layers 650, 660, and 670 may cause the buildup of the residue 605. The residue 605 may be formed on the tunnel barrier layer 670 and degrade the performance of the tunnel barrier layer 670.

Returning to FIG. 5, at block 520 of the process 500, gapfill dielectric material is formed in spaces between the patterned MRAM stacks. In some implementations, the gapfill dielectric material may be formed along sidewalls and on bottom surfaces of the patterned MRAM stacks. In some implementations, the gapfill dielectric material may be deposited using chemical vapor deposition (CVD), physical vapor deposition (PVD), or plasma-enhanced chemical vapor deposition (PECVD). However, it will be appreciated that the gapfill dielectric material may be deposited using any other suitable deposition technique such as atomic layer deposition (ALD). For example, the gapfill dielectric material may be deposited in the spaces between the patterned MRAM stacks using a deposition technique to accomplish bottom-up filling.

In some implementations, the gapfill dielectric material includes any suitable dielectric material such as silicon nitride, silicon oxide, silicon oxycarbide, germanium oxide, germanium nitride, magnesium oxide, or combinations thereof. For example, the gapfill dielectric material includes one or both of silicon nitride and silicon oxide. The gapfill dielectric material may include a layer of silicon nitride and a layer of silicon oxide, or may include just a layer of silicon nitride. In some implementations, it is desirable to avoid having silicon oxide directly contact the patterned MRAM stacks. The aforementioned dielectric materials may fill the spaces between patterned MRAM stacks, or at least fill the spaces above an underlayer. Forming the gapfill dielectric material in spaces between the patterned MRAM stacks may also be referred to as a "gapfill" or "dielectric gapfill" process.

In some implementations, gapfill may be performed in a deposition chamber such as a CVD, PVD, or PECVD chamber. Gapfill may be performed subsequent to the main etch and prior to an IBE trim etch. In some implementations, the main etch and the gapfill may be performed by an integrated tool or multi-station processing tool. Operations of the main etch at block 510 and the gapfill at block 520 may be performed without introducing a vacuum break in between the operations.

In some implementations, forming the gapfill dielectric material in spaces between the patterned MRAM stacks includes depositing the gapfill dielectric material in the spaces between the patterned MRAM stacks and over the patterned MRAM stacks, and selectively etching the gapfill dielectric material to a sufficient depth above the underlayer. In some implementations, a sufficient depth above the underlayer may correspond to a sufficient thickness so that at least some of the gapfill dielectric material remains after a subsequent trim etch at block 530. The gapfill dielectric material may be initially deposited over the patterned MRAM stacks to create an overburden. Gapfill deposition processes are typically conformal to some degree, resulting in materials being deposited along sidewalls, bottom surfaces, and top surfaces of the patterned MRAM stacks. The gapfill deposition processes may result in some "bread-loafing" as deposition rates may vary between a top surface of the patterned MRAM stacks and a bottom surface of the patterned MRAM stacks. This typically leads to an uneven topography from gapfill. Accordingly, an overburden of gapfill dielectric material may be deposited when filling the spaces between the patterned MRAM stacks, where the overburden of gapfill dielectric material may be non-uniform in thickness across the top surface of the gapfill dielectric material. In other words, some parts of the gapfill dielectric material are thicker than others.

After depositing the overburden of gapfill dielectric material above the patterned MRAM stacks, the overburden may be removed. In some implementations, the process 500 further includes planarizing the gapfill dielectric material deposited over the patterned MRAM stacks. For example, the overburden may be removed using chemical mechanical polishing (CMP) or etching.

In addition or in the alternative to planarization of the overburden, the deposited gapfill dielectric material may be selectively etched using a dry etch or wet etch technique, where the gapfill dielectric material is selectively etched to the depth above the underlayer. In some implementations, the depth may be between a top surface of the tunnel barrier layer and a top surface of the first magnetic layer, between a bottom surface of the tunnel barrier layer and a bottom surface of the second magnetic layer, or between the bottom surface of the second magnetic layer and a top surface of the underlayer. Where the plurality of MRAM layers include multiple tunnel barrier layers with multiple first/second magnetic layers, the depth may be measured against the lowest tunnel barrier layers and lowest first/second magnetic layers. In some implementations, the selective etch is a plasma etch that selectively removes the gapfill dielectric material without removing or without substantially removing any hard mask layer or MRAM layers. The etch may have an etch selectivity greater than about 10:1 between the gapfill dielectric material and the hard mask layer or MRAM layers, meaning that the gapfill dielectric material etches at an etch rate greater than ten times the hard mask layer or the MRAM layers. For example, the gapfill dielectric material can be etched with a fluorine plasma in a Reactive Ion Etch (RIE) or Chemical Downstream Etch (CDE) chamber. If the dielectric material is silicon oxide, it can also be removed with hydrogen fluoride (HF) vapor. The sufficient depth above the underlayer may be between about 1 nm and about 20 nm above the depth of the underlayer, between about 2 nm and about 15 nm above the depth of the underlayer, or between about 3 nm and about 10 nm above the depth of the underlayer. In some implementations, the selective etch may proceed to remove the gapfill dielectric material without exposing any of the underlayer. In some implementations, the selective etch may proceed to remove the gapfill dielectric material without significantly etching through the underlayer. As used herein, "significantly etching" through the underlayer may constitute etching through at least 3 nm or at least 5 nm of the underlayer. In some implementations, the sufficient depth above the underlayer may be above the tunnel barrier layer. As discussed above, exposing the tunnel barrier layer to reactive chemistries may damage the tunnel barrier layer. The selective etch leaves remaining gapfill dielectric material to serve as an etch front during an IBE trim etch for cleaning sidewalls of the patterned MRAM stacks. In some implementations, the selective etch may be stopped at the etch depth just above the depth of the tunnel barrier layer or at the sufficient depth above the underlayer using a suitable endpoint detection technique such as optical emission spectroscopy (OES) or interferometer endpoint detection (IEP). The selective etch may also be referred to as an "etchback" process or "isotropic etchback" process.

Figure 6B:
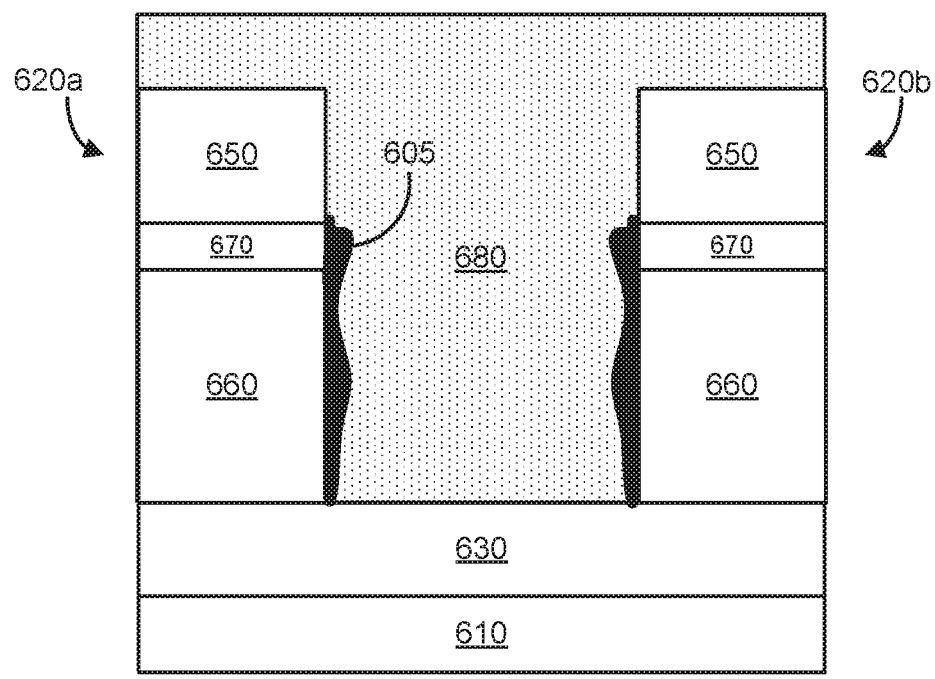

FIG. 6B shows a cross-sectional schematic illustration of an example gapfill process following the main etch of FIG. 6A according to some implementations. After the main etch, gapfill dielectric material 680 is deposited in spaces between the patterned MRAM stacks 620a, 620b using a suitable deposition technique such as CVD, PVD, or PECVD. In some implementations, the gapfill dielectric material 680 is conformally deposited along exposed surfaces (e.g., sidewalls) of the patterned MRAM stacks 620a, 620b to perform gapfill. Thus, any recesses, gaps, trenches, openings, or spaces are filled by the gapfill dielectric material 680. An overburden of the gapfill dielectric material 680 is deposited over the patterned MRAM stacks 620a, 620b. In some implementations, the gapfill dielectric material 680 includes silicon nitride or a combination of silicon nitride and silicon oxide.

Figure 6C:
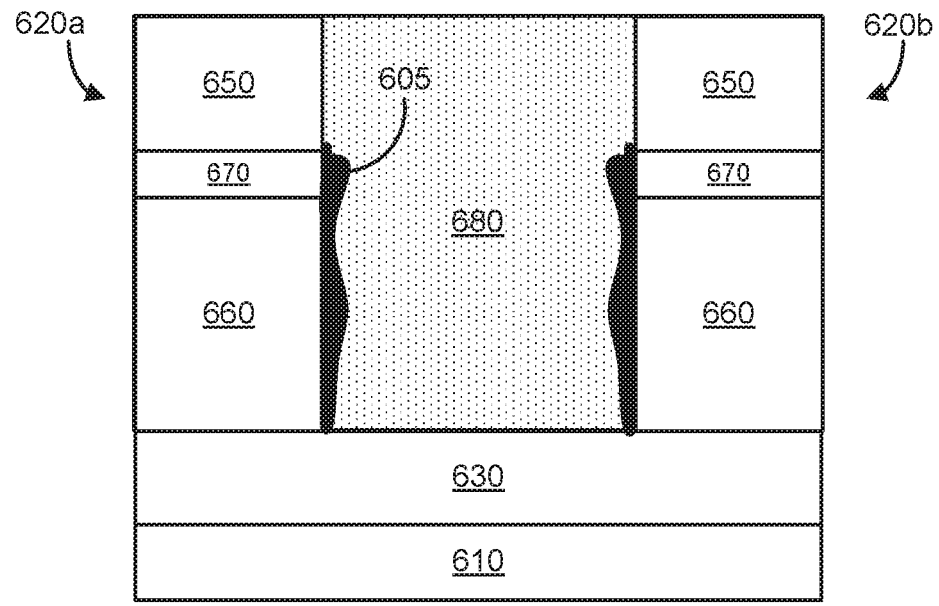

FIG. 6C shows a cross-sectional schematic illustration of an example planarization process following the gapfill process of FIG. 6B according to some implementations. After an overburden of the gapfill dielectric material 680 is deposited, a top surface of the overburden may be uneven. For example, an uneven topography may result in more dielectric gapfill material 680 in field regions compared to gapfill regions, which can lead to bread-loafing. A planarization process such as CMP or etch may be performed to smooth out the topography and remove the overburden.

Figure 6D:
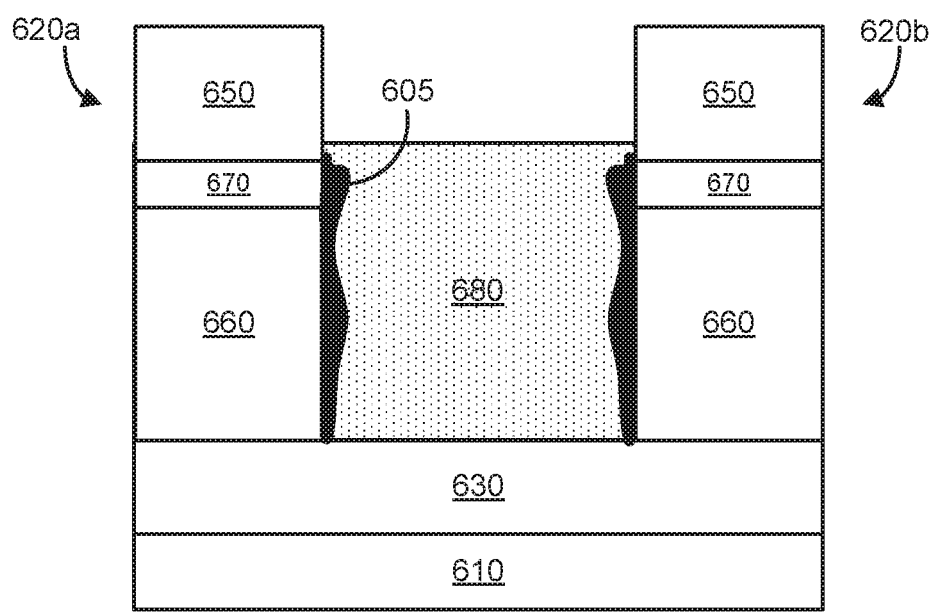

FIG. 6D shows a cross-sectional schematic illustration of an example etchback process following the planarization process of FIG. 6C according to some implementations. After the planarization process or the gapfill process, an etchback process is performed to remove the gapfill dielectric material 680 selectively against the plurality of MRAM layers 650, 660, and 670 or at least against the first magnetic layer 650. In some implementations, the etchback process removes the gapfill dielectric material 680 selectively against a hard mask layer. The etchback process may be a dry etch or a wet etch. The dry etch may be a plasma etch. The etchback process may be performed to remove the gapfill dielectric material 680 to an etch depth that is above the underlayer 630. In some implementations, the etchback process may be performed to remove the gapfill dielectric material 680 to an etch depth that is slightly above a depth of the tunnel barrier layer 670. Specifically, the etchback process may be performed to an etch depth that is slightly above an interface between the tunnel barrier layer 670 and the first magnetic layer 650. For example, the remaining gapfill dielectric material 680 may be at the etch depth that is a few nanometers above a top surface of the tunnel barrier layer 670. That way, the tunnel barrier layer 670 is not exposed to the etchback process. However, it will be understood that some implementations involving a conformal deposition process may not require this etchback or planarization process.

Returning to FIG. 5, at block 530 of the process 500, ion beam etching is performed to remove at least some of the gapfill dielectric material and electrically conductive materials deposited on sidewalls of the patterned MRAM stack. Ion beam etching after forming gapfill dielectric material above the underlayer serves to clean sidewalls of the patterned MRAM stacks. Ion beam etching to clean the sidewalls of the patterned MRAM stacks may remove the gapfill dielectric material to an etch depth below the depth of the tunnel barrier layer. In some implementations, the etch depth below the depth of the tunnel barrier layer does not reach to a depth of the underlayer. Ion beam etching to clean the sidewalls of the patterned MRAM stacks may also be referred to as an "overetch", "trim etch," "IBE trim etch," "sidewall clean etch" or "low power trim etch."

The materials deposited on sidewalls of the patterned MRAM stacks may include metals or electrically conductive materials. The metals or electrically conductive materials may be sputtered when performing the main etch at block 510 and re-deposited on the sidewalls of the patterned MRAM stacks. In other words, after the main etch, backsputtered and potentially damaging material may be located on the sidewalls of the patterned MRAM stacks. In some implementations, some metals may include W, Ta, Ti, or TiN from a hard mask layer or electrode layer, and some metals may include Co, Ni, Pt, or Fe from a first or second magnetic layer. The metals or electrically conductive materials form unwanted residue on the sidewalls of the patterned MRAM stacks and may degrade the electrical and magnetic properties of the MTJ stack. Ion beam etching is performed at block 530, where the ion beam etching is performed at low power and at an optimized angle of incidence to remove the unwanted residue.

When ion beam etching to remove materials re-deposited on the sidewalls of the patterned MRAM stacks, an ion beam may be generated from an ion beam source chamber using a gas mixture including inert gas. In some implementations, the gas mixture may include one or more reactive gases to increase material etching with a chemical/reactive component. In some implementations, the gas mixture is free or substantially free of reactive gases. Ion beam etching to remove materials re-deposited on sidewalls of the patterned MRAM stacks may be performed at relatively low voltages. In some implementations, etching to remove materials re-deposited on sidewalls of the patterned MRAM stacks may include applying an ion beam to the substrate having energies between about 20 eV and about 400 eV. The IBE trim etch may be performed at low ion energies to clean off unwanted residue relative to a main etch. In some implementations, the IBE trim etch can be performed in about 1 minute or more, 3 minutes or more, 5 minutes or more, or 10 minutes or more. In some implementations, the IBE trim etch may be performed in alternating first and second directions with or without rotation of the substrate. Low ion energies are desirable for trimming to reduce effects of ion induced intermixing of the MTJ layers.

In some implementations, IBE trim etch may be performed in an ion beam etching apparatus such as an ion beam etching apparatus described in FIG. 3. IBE trim etch may be performed subsequent to the gapfill, subsequent to planarization, or subsequent to etchback. In some implementations, the IBE trim etch and the gapfill may be performed by an integrated tool or multi-station processing tool. Operations of the gapfill at block 520 and the IBE trim etch at block 530 may be performed without introducing a vacuum break in between the operations. In some implementations, operations of the main etch at block 510, the gapfill at block 520, and the IBE trim etch at block 530 may be performed without introducing a vacuum break in between operations.

Metals and other electrically conductive materials are preferably not exposed during the IBE trim etch. The remaining gapfill dielectric material serves as the etch front during the IBE trim etch so that any backsputtering of metals or electrically conductive materials is greatly reduced. Instead, with an etch front of the gapfill dielectric material, any backsputtering of dielectric material does not adversely affect the electrical and magnetic properties of the MTJ stack. The IBE trim etch may remove the gapfill dielectric material to an etch depth below an interface between the tunnel barrier layer and the second magnetic layer without etching into the underlayer. This maintains the initial etch front from the main etch at block 510 and prevents recessing or significant recessing into the underlayer.

In some implementations, the IBE trim etch removes materials deposited on the exposed sidewalls of the patterned MRAM stacks. The exposed sidewalls of the patterned MRAM stacks are free or substantially free of metals or electrically conductive materials deposited on the sidewalls of the patterned MRAM stacks. A threshold for when the sidewall is deemed to be sufficiently clean can be set by the shorting performance of the MRAM devices. It is measured as the ratio of shorted devices amongst all devices. Typically, only one in a million devices or less must be shorted. Thus, any remaining residue is sufficiently thin to have minimal impact to the off-state resistance of the MRAM device. For example, "substantially free" with respect to re-deposited electrically conductive materials can refer to a deposited thickness that is less than about 1.5 nm, less than about 1.0 nm, or less than about 0.5 nm. Thus, any re-deposited electrically conductive materials on the tunnel barrier layer after the IBE trim etch is negligible or null. The IBE trim etch may be performed long enough to remove unwanted materials so that the exposed sidewalls of the patterned MRAM stacks are free or substantially free of re-deposited electrically conductive materials.

Figure 6E:
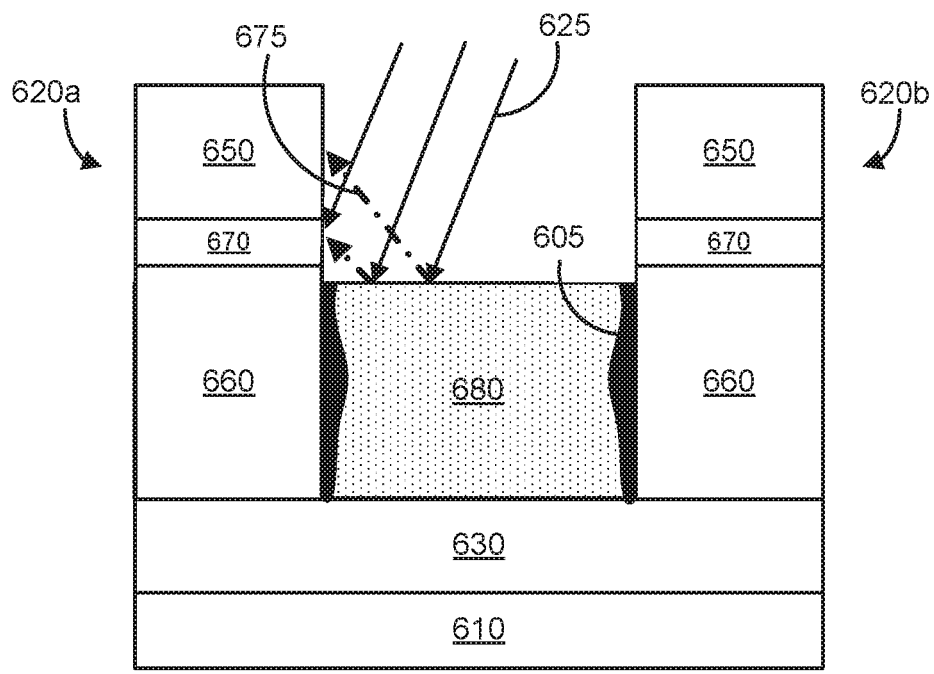

FIG. 6E shows a cross-sectional schematic illustration of an example IBE trim etch process following the etchback process of FIG. 6D according to some implementations. The remaining gapfill dielectric material 680 serves as an etch front during the IBE trim etch process. During the IBE trim etch process, an ion beam 625 is provided at relatively low ion energies and an optimized angle of incidence for cleaning the sidewalls of the patterned MRAM stacks 620a, 620b. The ion beam 625 removes the residue 605 from the sidewalls of the patterned MRAM stacks 620a, 620b as the IBE trim etch process proceeds. Sputtered atoms and/or molecules 675 from the ion beam 625 may be directed towards the sidewalls of the patterned MRAM stacks 620a, 620b. However, the sputtered atoms and/or molecules 675 include dielectric materials from the remaining gapfill dielectric material 680 that do not adversely impact the properties of the patterned MRAM stacks 620a, 620b. The IBE trim etch process proceeds to an etch depth that is below the depth of tunnel barrier layer 670 and above the underlayer 630. In some implementations, the IBE trim etch process does not proceed significantly into the underlayer 630. Exposed sidewalls of the patterned MRAM stacks 620a, 620b are free of the residue 605 containing electrically conductive materials or magnetic materials.

In some implementations, the process 500 further includes conformally depositing an encapsulation material on at least the exposed sidewalls of the patterned MRAM stacks after performing the IBE trim etch at block 530. The encapsulation material may include a suitable dielectric material such as silicon nitride. The encapsulation material may be deposited to prevent or minimize damage to the tunnel barrier layer that may be exposed to air.

Figure 6F:
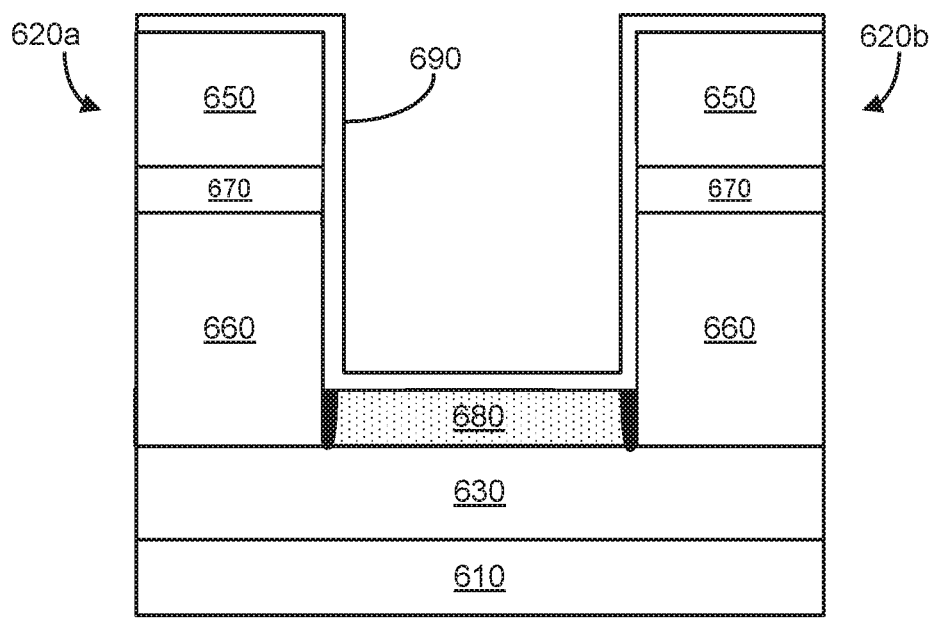

FIG. 6F shows a cross-sectional schematic illustration of an example encapsulation process following the IBE trim etch process of FIG. 6E according to some implementations. An encapsulation layer 690 includes a dielectric material such as silicon nitride and is conformally deposited on exposed surfaces of the patterned MRAM stacks 620a, 620b. The encapsulation layer 690 is conformally deposited along the sidewalls of the patterned MRAM stacks 620a, 620b and serves to at least protect the tunnel barrier layer 670 from exposure to ambient environments.

Figure 7:
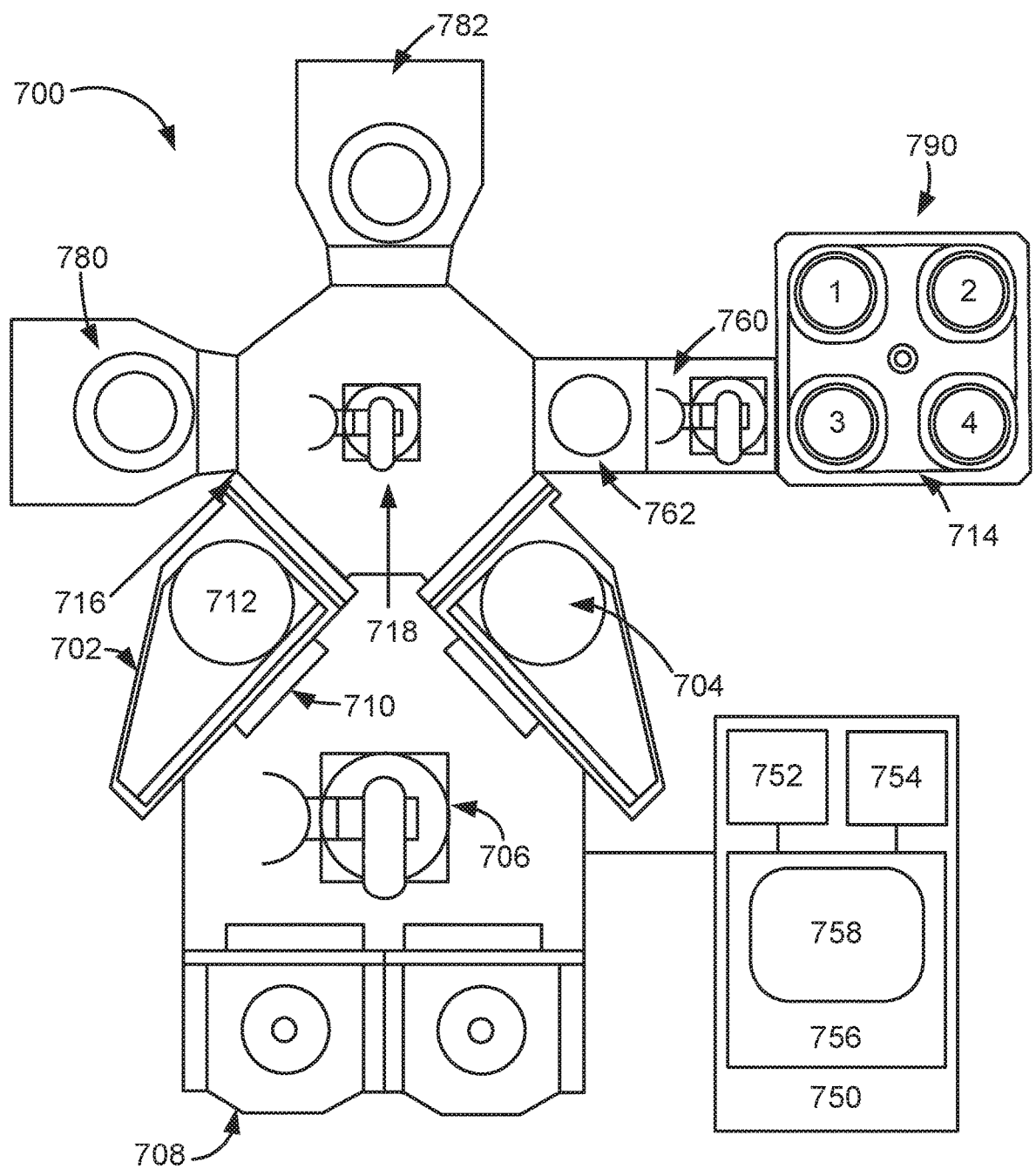
FIG. 7 shows a block diagram of an example processing system for performing deposition and ion beam etching processes according to some implementations.

FIG. 7 shows a block diagram of an example processing system for performing deposition and ion beam etching processes according to some implementations. A processing system 700 may be a multi-station processing tool with one or more process stations. The processing system 700 may include an inbound load lock 702 and an outbound load lock 704, either or both of which may include a plasma-generating source. A robot 706 at atmospheric pressure is configured to move substrates from a cassette loaded through a pod 708 into the inbound load lock 702 via an atmospheric port 710. A substrate is placed by the robot 706 on a pedestal 712 in the inbound load lock 702, the atmospheric port 710 is closed, and the load lock 702 is pumped down. A chamber transport port 716 processing chamber 714 is opened, and another the substrate handling system 718 that serves as another robot places the substrate into one of the processing stations 780, 782, or loading station to processing station 790 for processing. While the implementation depicted in FIG. 7 includes load locks, it will be appreciated that, in some implementations, direct entry of a substrate into a processing station may be provided.

The depicted processing chamber 714 includes three process stations 780, 782, and 790. Processing station 790 may be a removable module and may be suitable for processing more than one substrate at a time. In this example, processing station 790 includes four substations, numbered 1 to 4 in the implementation shown in FIG. 7.

Each processing station (780, 782, and each of 1, 2, 3, and 4) may have a heated pedestal, and gas line inlets. It will be appreciated that in some implementations, each processing station may have different or multiple purposes. For example, in some implementations, processing station 780 may be used for deposition of gapfill dielectric material on the substrate, where the deposition technique may be CVD, PECVD, or other suitable deposition technique. In some implementations, processing station 782 may be used for performing main etch by IBE, and processing station 790 may be used for performing an IBE trim etch. In some other implementations, processing station 790 may be used for performing ion beam etching for both main etch and IBE trim etch. Processing station 782 may be used for performing other processes such as CMP, selective etchback, or CVD/PECVD/PVD. In some implementations, the processing station 790 may have multiple substations 1-4 for performing multiple IBE trim etch processes or other processes. IBE trim etch may take longer than main etch and deposition processes. While the depicted processing station 790 includes four substations, it will be understood that a processing station according to the present disclosure may include any suitable number of substations. Additionally, while the processing system 700 includes three processing stations (780, 782, and 790), it will be understood that in some implementations, an apparatus may include more than or less than three stations as each station may be a removable or modifiable module. For example, in some implementations, a processing system 700 may have four or more stations, while in some other implementations, a processing system 700 may have two or fewer stations. In some implementations, an additional processing station may be used for performing a planarization process such as CMP. In some implementations, an additional processing station may be used for performing a selective etchback to remove gapfill dielectric material.

In some implementations, the processing system 700 may be an integrated multi-station processing tool for performing IBE (main etch and trim etch) and CVD/PECVD/PVD/. For example processing stations 780, 782, and 790 may be used to perform main etch, gapfill, trim etch, and encapsulation operations. Operations of main etch, gapfill, trim etch, and encapsulation may occur without introducing a vacuum break in between the operations. Additional operations of planarization (e.g., CMP) and/or selective etchback (e.g., plasma etch) may be performed in a separate tool or in the integrated multi-station processing tool. It will be appreciated that such operations may be performed in a separate tool since a tunnel barrier layer of an MTJ stack will not be exposed to air or an ambient environment during planarization or selective etchback. The tunnel barrier layer is protected by a gapfill dielectric material during planarization or selective etchback.

FIG. 7 shows a substrate handling system 718 for transferring substrates within the processing system 700. In some implementations, the substrate handling system 718 may transfer substrates between various processing stations and/ or between a processing station and a load lock. Additionally, processing station 790 may include a separate substrate handling system 760 used for moving a substrate from another loading station 762 to the processing station 790. It will be appreciated that any suitable substrate handling system may be employed. Non-limiting examples include substrate carousels and substrate handling robots.

In various implementations, integration of various stations may address footprint reduction concerns, and integration of various stations may enable efficient transfer of substrates between operations without introducing a vacuum break. FIG. 7 also depicts an implementation of a system controller 750 employed to control process conditions and hardware states of the processing system 700. The system controller 750 may include one or more memory devices 756, one or more mass storage devices 754, and one or more processors 752. Aspects of the system controller 750 are described above with respect to FIG. 3. Depending on the processing step or steps to be performed by the tool, the system controller 950 might communicate with one or more other tool circuits or modules, other too components, cluster tools, other tool interfaces, adjacent tools, neighboring tools, tools located throughout a factory, a main computer, another controller, or tools used in material transport that bring containers of substrates to and from tool locations.

Figure 8:
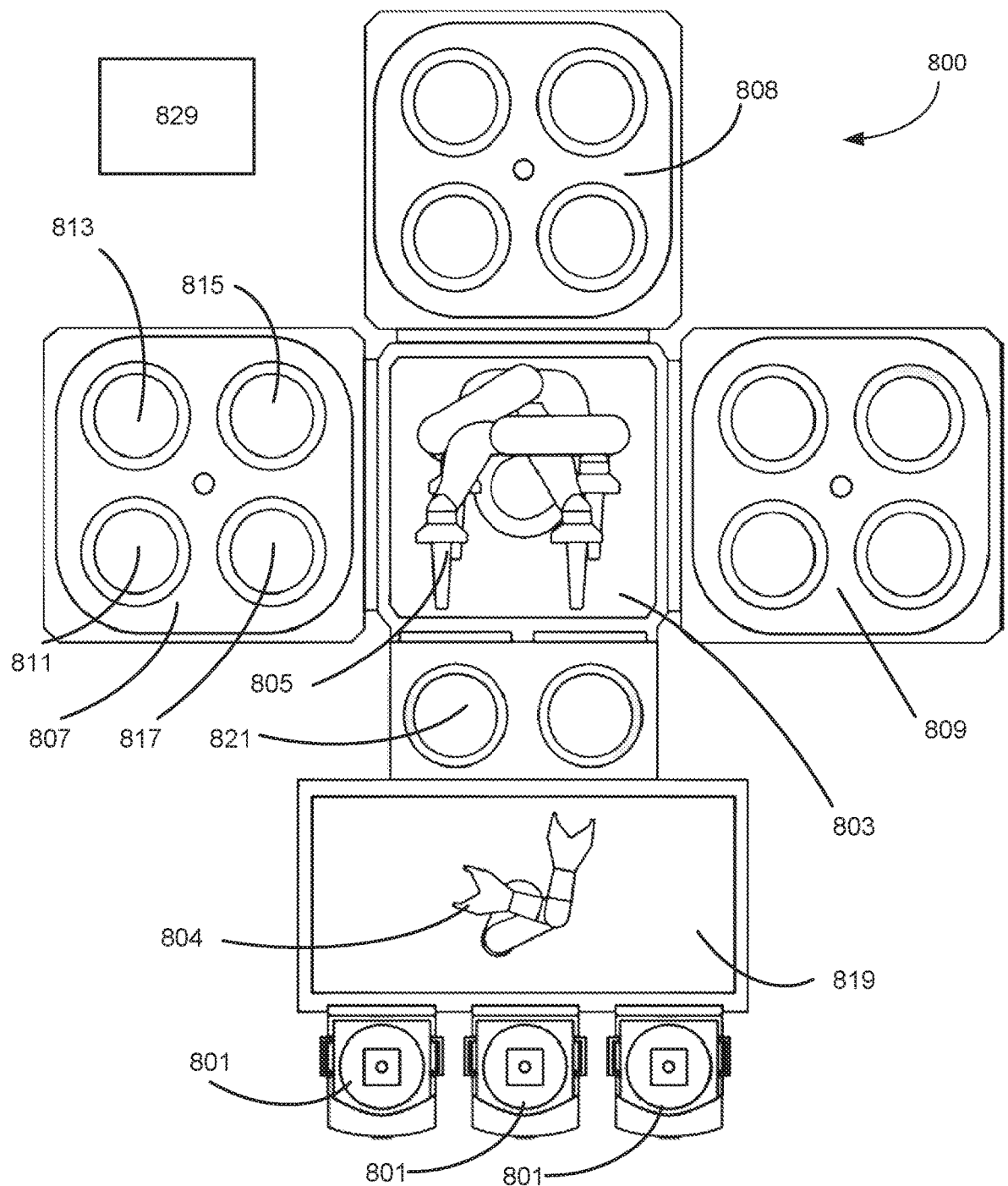
FIG. 8 shows an alternative block diagram of an example processing system for performing deposition and ion beam etching processes according to some implementations.

FIG. 8 shows an alternative block diagram of an example processing system for performing deposition and ion beam etching processes according to some implementations. The processing system 800 includes a transfer module 803. The transfer module 803 provides a clean, pressurized environment to minimize risk of contamination of substrates being processed as they are moved between various reactor modules. Mounted on the transfer module 803 are multi-station reactors 807, 808, and 809, referred to in this context as reactor or tool modules or simply modules, each capable of performing ion beam etching and/or deposition. Reactors 807, 808, and 809 may include multiple stations 811, 813, 815, and 817 that may sequentially or non-sequentially perform operations in accordance with the disclosed implementations. The stations 811, 813, 815, and 817 may each include a heated pedestal or substrate support, one or more gas inlets or showerhead or dispersion plate. One or more of the modules 807, 808, and 809 may be capable of performing ion beam etching, where the ion beam etching may be used to perform a main etch and/or trim etch. Thus, one or more of the modules 807, 808, and 809 may include an ion beam etching apparatus with an ion beam source chamber and a processing chamber as described above in FIG. 3. Another one or more of the modules 807, 808, and 809 may be capable of performing a deposition operation such as CVD/PECVD/PVD. Accordingly, operations of main etch, gapfill, trim etch, and encapsulation may occur without introducing a vacuum break in between the operations.

The processing system 800 may also include one or more substrate source modules 801, where substrates are stored before and after processing. An atmospheric robot 804 and atmospheric transfer chamber 819 may first remove substrates from the source modules 801 to load locks 821. A second substrate transfer device (generally a robot arm unit) 805 in the transfer module 803 moves the substrates from load locks 821 to and among the modules mounted on the transfer module 803 in a pressurized (e.g., vacuum) environment.

In various implementations, a system controller 829 is employed to control process conditions and activities during processing. The system controller 829 will typically include one or more memory devices and one or more processors. Aspects of the system controller 829 are described above with respect to FIG. 3. Depending on the processing step or steps to be performed by the tool, the system controller 829 might communicate with one or more other tool circuits or modules, other too components, cluster tools, other tool interfaces, adjacent tools, neighboring tools, tools located throughout a factory, a main computer, another controller, or tools used in material transport that bring containers of substrates to and from tool locations.

Figure 9:
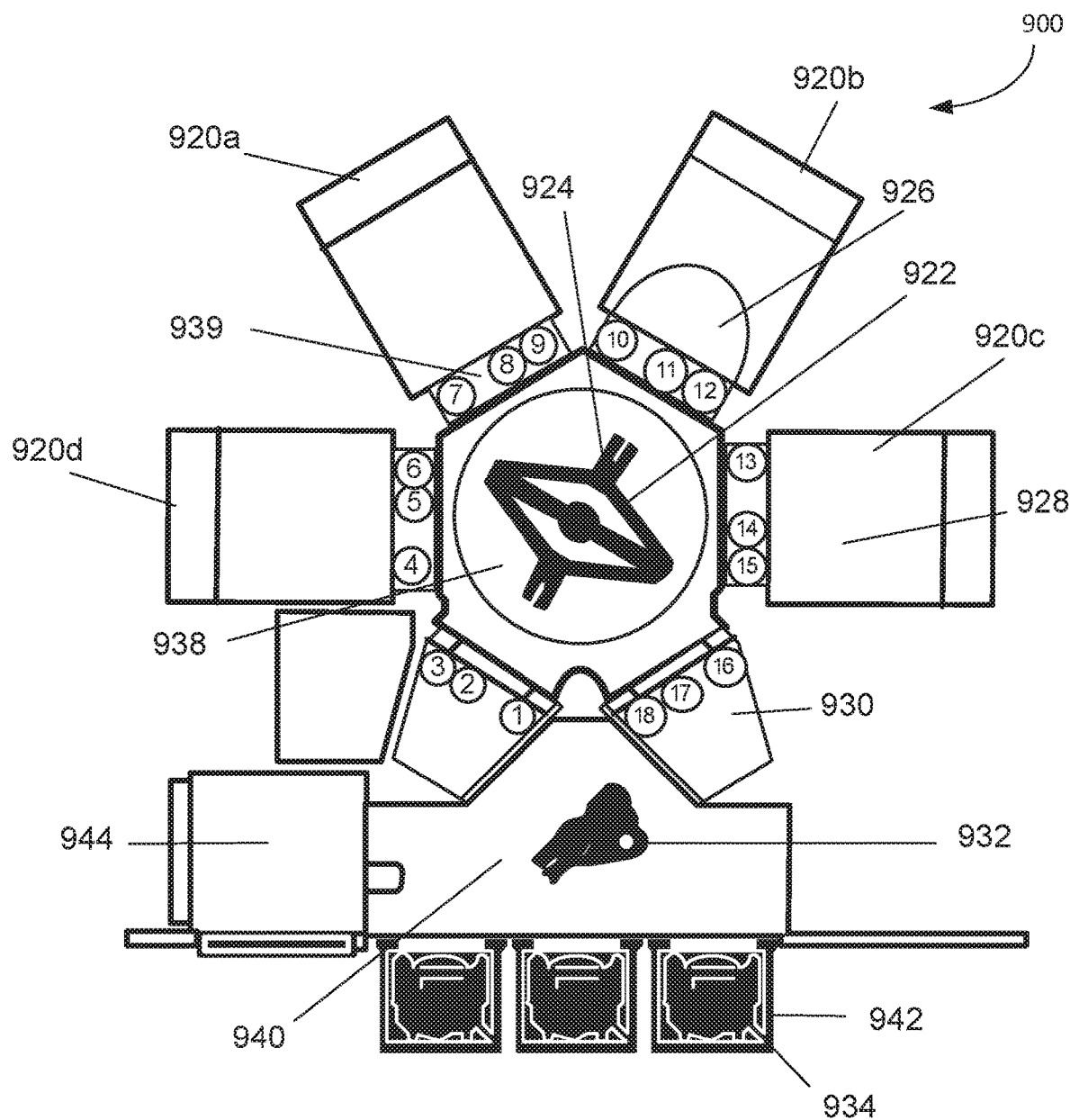
FIG. 9 shows a block diagram of an example processing system for performing planarization and/or etching processes according to some implementations.

FIG. 9 shows a block diagram of an example processing system for performing planarization and/or etching processes according to some implementations. The processing systems 700 and 800 may be integrated multi-station processing tools for performing ion beam etching and deposition, and may transfer substrates to a processing system 900 for performing planarization and/or selective etch processes.

The processing system 900 may include a vacuum transfer module 938 (VTM). The arrangement of transfer modules to transfer substrates among multiple storage facilities and processing modules may be referred to as a "cluster tool architecture" system. Airlock 930, also known as a load lock or transfer module, is shown in the vacuum transfer module 938 with four processing modules 920a, 920b, 920c, and 920d, which may be individually optimized to perform various operations. By way of example, one or more of the processing modules 920a, 920b, 920c, and 920d may be implemented to perform selective etching. One or more of the processing modules 920a, 920b, 920c, and 920d may be implemented to perform a planarization process such as CMP. In some implementations, one or more of the processing modules 920a, 920b, 920c, and 920d may be implemented to perform ion beam etching or deposition. Airlock 930 and processing modules 920a, 920b, 920c, and 920d may be referred to as "stations." Each station has a facet 936 that interfaces the station to the vacuum transfer module 938. Inside each facet 936, sensors 1-18 are used to detect the passing of substrate 926 when moved between respective stations.

Robot 922 may be used to transfer substrate 926 between stations. In one implementation, robot 922 has one arm, and in another implementation, robot 922 has two arms, where each arm has an end effector 924 to pick substrates such as substrate 926 for transport. Front-end robot 932, in atmospheric transfer module (ATM) 940, is used to transfer substrates 926 from cassette or Front Opening Unified Pod (FOUP) 934 in Load Port Module (LPM) 942 to airlock 930. Module center 928 inside processing modules 920a, 920b, 920c, and 920d is one location for placing substrate 926. Aligner 944 in the ATM 940 is used to align substrates.

In an example processing method, a substrate is placed in one of the FOUPs 934 in the LPM 942. Front-end robot 932 transfers the substrate from the FOUP 934 to the aligner 944, which allows the substrate 926 to be properly centered before it is etched or processed. After being aligned, the substrate 926 is moved by the front-end robot 932 into an airlock 930. Because airlock modules have the ability to match the environment between an ATM and a VTM, the substrate 926 is able to move between the two pressure environments without being damaged. From the airlock 930, the substrate 926 is moved by the robot 922 through the vacuum transfer module 938 and into one of the processing modules 920a, 920b, 920c, and 920d. In order to achieve this substrate movement, the robot 922 uses end effectors 924 on each of its arms. Once the substrate 926 has been processed, it is moved by the robot 922 from the processing modules 920a, 920b, 920c, and 920d to an airlock 930. From here, the substrate 926 may be moved by the front-end robot 932 to one of the FOUPs or to the aligner 944. A controller as described above with respect to FIG. 3 may be implemented with the tool in FIG. 9. Depending on the processing step or steps to be performed by the tool, the controller might communicate with one or more other tool circuits or modules, other too components, cluster tools, other tool interfaces, adjacent tools, neighboring tools, tools located throughout a factory, a main computer, another controller, or tools used in material transport that bring containers of substrates to and from tool locations.

Conclusion

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. An ion beam etching method, the method comprising:
    etching through a plurality of magnetoresistive random access memory (MRAM) layers disposed on a substrate to form patterned MRAM stacks, wherein the plurality of MRAM layers include one or more magnetic layers and a tunnel barrier layer, wherein etching through the plurality of MRAM layers includes ion beam etching (IBE) through at least the tunnel barrier layer;
    forming a gapfill dielectric material in spaces between the patterned MRAM stacks; and
    performing an IBE trim etch to remove at least some of the gapfill dielectric material and electrically conductive materials deposited on sidewalls of the patterned MRAM stacks.

2. The method of claim 1, wherein the gapfill dielectric material is formed to a sufficient depth above an underlayer disposed between the substrate and the plurality of MRAM layers so that performing the IBE trim etch does not cause recess into the underlayer.

3. The method of claim 2, wherein the sufficient depth above the underlayer is between about 1 nm and about 20 nm above a top surface of the underlayer.

4. The method of claim 1, wherein forming the gapfill dielectric material in spaces between the patterned MRAM stacks comprises:
    depositing the gapfill dielectric material in the spaces between the patterned MRAM stacks and over the patterned MRAM stacks.

5. The method of claim 4, wherein forming the gapfill dielectric material in spaces between the patterned MRAM stacks further comprises:
    selectively etching the gapfill dielectric material to an etch depth above the depth of the tunnel barrier layer.

6. The method of claim 5, further comprising:
    planarizing the gapfill dielectric material deposited over the patterned MRAM stacks.

7. The method of claim 1, wherein the gapfill dielectric material includes silicon nitride, silicon oxide, silicon oxycarbide, germanium oxide, magnesium oxide, germanium nitride, or combinations thereof.

8. The method of claim 7, wherein the gapfill dielectric material includes one or both of silicon nitride and silicon oxide.

9. The method of claim 1, wherein operations of etching through the plurality of MRAM layers, forming the gapfill dielectric material, and performing the IBE trim etch are performed without introducing a vacuum break in between operations.

10. The method of claim 1, wherein the plurality of MRAM layers includes a first magnetic layer, a second magnetic layer, the tunnel barrier layer between the first magnetic layer and the second magnetic layer, and an underlayer disposed below the second magnetic layer, wherein the underlayer includes a dielectric material, and wherein the tunnel barrier layer includes a non-magnetic insulating material.

11. The method of claim 10, wherein etching through the plurality of MRAM layers includes ion beam etching through the first magnetic layer, the tunnel barrier layer, and the second magnetic layer without etching through the underlayer.

12. The method of claim 10, wherein etching through the plurality of MRAM layers includes reactive ion etching (ME) through the first magnetic layer and ion beam etching through the tunnel barrier layer.

13. The method of claim 10, wherein etching through the plurality of MRAM layers includes etching through the first magnetic layer, the tunnel barrier layer, and the second magnetic layer, wherein etching through the plurality of MRAM layers is stopped on the underlayer.

14. The method of claim 1, wherein ion beam etching through at least the tunnel barrier layer includes applying a first ion beam to the substrate having an energy between about 200 eV and about 10,000 eV, and wherein performing an IBE trim etch includes applying a second ion beam to the substrate having an energy between about 20 eV and about 400 eV.

15. The method of claim 1, wherein performing an IBE trim etch occurs without etching through an underlayer disposed below the plurality of MRAM layers.

16. The method of claim 1, wherein the electrically conductive materials include tungsten (W), titanium (Ti), tantalum (Ta), titanium nitride (TiN), tantalum nitride (TaN), cobalt (Co), nickel (Ni), iron (Fe) platinum (Pt), ruthenium (Ru), or combinations thereof, and wherein the sidewalls of the patterned MRAM stacks are substantially free of the electrically conductive materials deposited on the sidewalls of the patterned MRAM stacks after performing the IBE trim etch.

17. The method of claim 1, further comprising:
    conformally depositing an encapsulation material on at least the sidewalls of the patterned MRAM stacks after performing the IBE trim etch.

* * * * *